United States Patent [19]

Fukaya et al.

[11] Patent Number: 5,306,648
[45] Date of Patent: Apr. 26, 1994

[54] METHOD OF MAKING PHOTOELECTRIC CONVERSION DEVICE

[75] Inventors: Masaki Fukaya, Isehara; Soichiro Kawakami, Nagahama; Satoshi Itabashi, Atsugi; Katsunori Terada, Sagamihara; Ihachiro Gofuku, Hiratsuka; Katsumi Nakagawa, Nagahama; Katsunori Hatanaka; Yoshinori Isobe, both of Yokohama; Toshihiro Saika, Atsugi; Tetsuya Kaneko, Yokohama; Nobuko Kitahara, Tama; Hideyuki Suzuki, Machida, all of Japan

[73] Assignee: Canon Kabushiki Kaisha, Tokyo, Japan

[21] Appl. No.: 907,287

[22] Filed: Jul. 1, 1992

Related U.S. Application Data

[60] Division of Ser. No. 496,402, Mar. 20, 1990, abandoned, which is a division of Ser. No. 412,586, Sep. 25, 1989, Pat. No. 4,931,661, which is a continuation of Ser. No. 246,962, Sep. 21, 1988, abandoned, which is a continuation of Ser. No. 5,886, Jan. 22, 1987, abandoned.

[30] Foreign Application Priority Data

| Jan. 24, 1986 | [JP] | Japan | 61-11981 |
| Jan. 24, 1986 | [JP] | Japan | 61-11982 |
| Feb. 20, 1986 | [JP] | Japan | 61-33777 |
| Jun. 7, 1986 | [JP] | Japan | 61-131099 |
| Jun. 23, 1986 | [JP] | Japan | 61-144990 |
| Jun. 30, 1986 | [JP] | Japan | 61-153281 |

[51] Int. Cl.⁵ .................................................. H01L 21/205
[52] U.S. Cl. ................................................ 437/3; 437/47
[58] Field of Search ........................ 437/47, 3; 357/30 H

[56] References Cited

U.S. PATENT DOCUMENTS

| 4,461,956 | 7/1984 | Hatanaka et al. | 357/32 |
| 4,466,177 | 8/1984 | Chao | 437/47 |
| 4,532,536 | 7/1985 | Hatanaka et al. | 357/30 |
| 4,734,382 | 3/1988 | Krishna | 437/47 |
| 4,763,010 | 8/1988 | Fukaya et al. | 357/2 |

FOREIGN PATENT DOCUMENTS

| 59-129461 | 7/1984 | Japan | 437/47 |
| 63-124533 | 5/1988 | Japan | 437/47 |

Primary Examiner—Olik Chaudhuri
Assistant Examiner—Ourmazd S. Ojan
Attorney, Agent, or Firm—Fitzpatrick, Cella, Harper & Scinto

[57] ABSTRACT

A photoelectric conversion device having a photoelectric conversion section and a transistor for transferring or amplification of the photoelectric conversion signal or an accumulating section of a photo carrier. The photoelectric conversion section and the transistor or the accumulating section have common semiconductor layer.

4 Claims, 21 Drawing Sheets

SIGNAL PROCESSING CIRCUIT

SIGNAL OUTPUT

METHOD OF MAKING PHOTOELECTRIC CONVERSION DEVICE

This application is a division of application Ser. No. 07/496,402, filed Mar. 20, 1990, now abandoned, which is a division of application Ser. No. 07/412,586, filed Sep. 25, 1989, issued as U.S. Pat. No. 4,931,661, on Jun. 5, 1990, which is a continuation of application Ser. No. 07/246,962, filed Sep. 21, 1988, now abandoned, which is a continuation of application Ser. No. 07/005,886, filed Jan. 22, 1987, now abandoned.

BACKGROUND OF THE INVENTION

1. Field of the Invention

The present invention relates to a photoelectric conversion device.

2. Related Background Art

It is well known that photo-sensors are used as photoelectric conversion devices in various picture information handling apparatus such as facsimiles, digital copiers and character readers. In modern apparatus, photosensors are arranged linearly to form a long sensor. The sensor is capable of reading picture image with a high level of accuracy. Recently, as a photosensor which provides an inexpensive high-speed picture reading apparatus, a sensor has been proposed in which a thin film transistor (referred to as TFT hereinafter) of amorphous silicon is connected to a photoelectric converting section which is constituted by an array of photo-sensor elements which also are made of amorphous silicon. The photo-sensor of this type is inexpensive and is capable of reading picture information at a high speed. In this sensor, parallel signals output from the array of photo-sensor elements are changed into a serial signal by means of the switching TFT. This arrangement enables the number of the driving ICs to be decreased, thereby reducing the cost of the driving circuit.

In the photosensor employing a TFT, however, is disadvantageous in that the number of steps is increased because the photoelectric conversion section and the TFT have to be produced independently, with the result that the production cost is increased and that the yield is lowered.

SUMMARY OF THE INVENTION

Accordingly, an object of the present invention is to provide a photoelectric conversion device having a construction which is easy to produce.

Another object of the present invention is to provide a photoelectric conversion device in which the photoelectric section and the transferring section constituted by transistors are constituted by the same amorphous silicon (a-Si) layer, thus reducing the number of steps in the production process, thereby reducing the production cost.

A further object of the present invention is to provide a photoelectric conversion device in which problems or difficulties concerning the etching between the insulating layer and the semiconductor layer are overcome, thereby facilitating the production.

DESCRIPTION OF THE PREFERRED EMBODIMENTS

The preferred embodiments of the present invention will be described herein under with reference to the accompanying drawings.

Figure 1A:
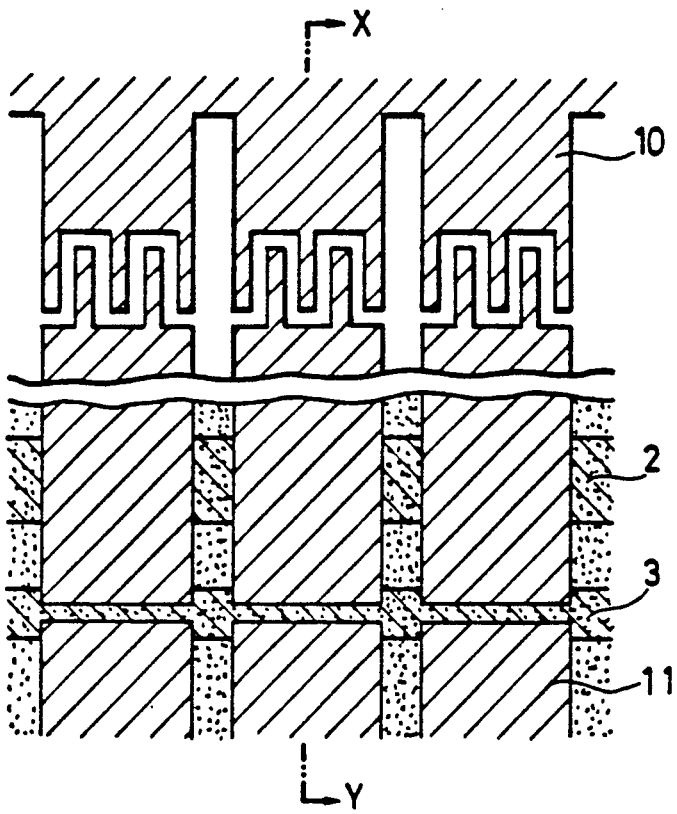
FIG. 1A is a plan view of a portion of an embodiment of a photoelectric conversion device in accordance with the present invention.
Figure 1B:
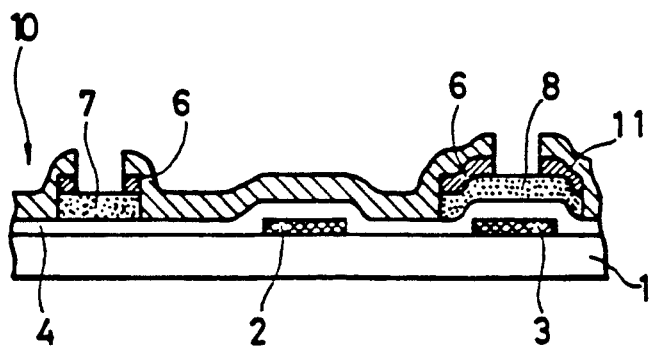
FIG. 1B is a cross-sectional view taken along the line X-Y of FIG. 1A.

FIGS. 1A and 1B show an embodiment of a photoelectric conversion device in accordance with the present invention. More particularly, FIG. 1A is a fragmentary sectional view showing a photo-sensor array incorporated in the device, while FIG. 1B is a sectional view taken along the line X-Y of FIG. 1A.

Referring to these Figures, the photo-sensor arrays have a glass substrate 1, an underlying electrode 2 of a capacitor, a gate electrode 3, an insulating layer 4, an ohmic contact layer 6 consisting of an n+ layer, a photoconductive layer 7 of a photoelectric conversion section, and a semiconductor layer 8 of a TFT. The photoconductive layer 7 and the semiconductor layer 8 are made of the same amorphous silicon layer. The photo-sensor array further has a common electrode 10 and signal deriving line 11. An incident light impinges upon the photoconductive layer 7 so as to be converted by the latter into parallel electric signals which in turn are further converted into serial electric signals.

An example of the process for producing the photo-sensor array shown in FIGS. 1A and 1B will be explained herein under with reference to FIGS. 2A to 2D.

Figure 2A:
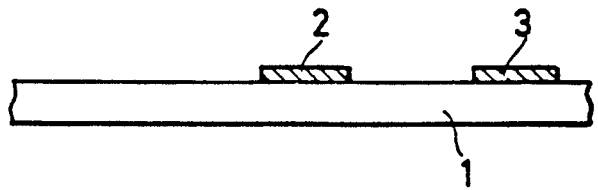
FIGS. 2A to 2D are cross-sectional views illustrating different steps of a process for producing the device shown in FIGS. 1A and 1B.

A glass substrate 1 (Coning No. 7059) polished at both surfaces is cleaned with an ordinary neutral detergent or an organic alkali detergent. Then, Cr is deposited to a thickness of 0.15μ by electron beam evaporation deposition method. Then, a photo-resist pattern of a desired shape is formed by using a posi-type photo-resist (AZ-1370 made by Sibure). Subsequently, the unnecessary Cr is removed by an aqueous solution of a mixture of ammonium secondary cerium nitrate and perchloric acid, so as to form the underlying electrode 2 of capacitor and the gate electrode 3, as shown in FIG. 2A.

Figure 2B:
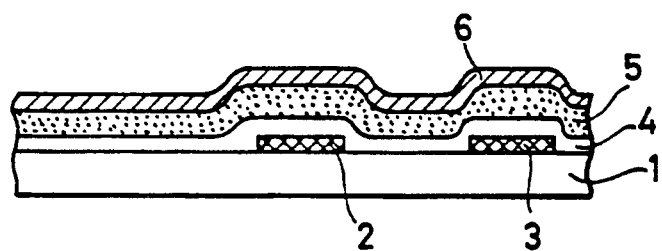

Subsequently, the glass substrate 1 is placed in a glow discharge decomposition apparatus of capacitance coupling type so as to be held in a vacuum atmosphere of a pressure of $1 \times 10^{-6}$ Torr at 230° C. Subsequently, SiH$_4$ diluted to 10% by H$_2$ and NH$_3$ are simultaneously supplied into the apparatus at flow rates of 5 SCCM and 20 SCCM, respectively. Then, a glow discharge is effected for 2 hours at RF discharge power of 15W, using a high-frequency power supply of 13.56 MHz, so as to form an insulating layer 4 of silicon nitride to a thickness of 0.3μ. Then, SiH$_4$ gas is supplied at a flow rate of 10 SCCM, and glow discharge is effected for 2.5 hours with discharge power of 8W and gas pressure of 0.07 Torr so as to form an amorphous silicon intrinsic layer to a thickness of 0.50μ. Then, an n+ layer 6 constituting an ohmic contact layer is deposited to a thickness of 0.12μ as shown in FIG. 2B, using as the material a gas composed of SiH$_4$ diluted by H$_2$ to 10% and PH$_3$ diluted by H$_2$ to 100 ppm mixed at a ratio of SiH$_4$; PH$_3$=1:10, with a discharge power of 30W.

Figure 2C:
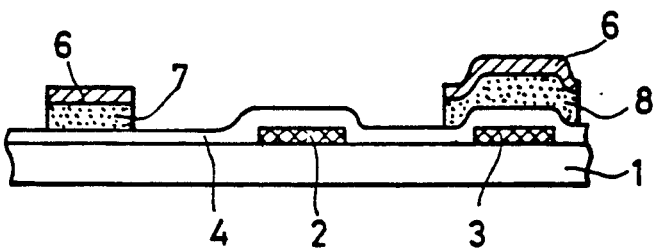

Subsequently, a desired pattern is formed by using a posi-type photo-resist (OFPR-1300 made by Tokyo Osuka Kogyo), and a dry etching by plasma etching method is conducted with CF$_4$ gas of a pressure of 0.30 Torr and an RF discharging power of 100W, so as to remove the unnecessary portions of the n+ layer and the intrinsic layer amorphous silicon, thereby forming amorphous silicon photoconductive layer 7 and a semiconductor layer 8, as shown in FIG. 2C.

Figure 2D:
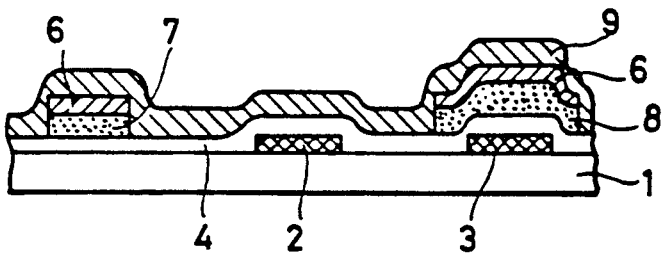

Then, Al is deposited by electron beam deposition method to a thickness of 0.5μ so as to form a conductive layer, as shown in FIG. 2D.

Then, after forming a photo-resist pattern into a desired form, exposed portions of the conductive layer 9 are removed by a mixture constituted by phosphoric acid (85 vol. % aqueous solution), nitric acid (60 vol. % aqueous solution), glacial acetic acid and water which are mixed at a volumetric ratio of 16:1:2:1, thereby forming a common electrode 10 and a signal deriving line 11. Subsequently, dry etching is conducted by plasma etching method using a CF$_4$ gas, so as to remove unnecessary portion of the n+ layer, thereby forming an n+ layer of the desired pattern. Subsequently, the photo-resist is separated so that the photo-sensor array shown in FIG. 1B is formed.

The photo-sensor of this embodiment remarkably reduces the number of steps of the production process as compared with conventional photo-sensor array which is produced by a process in which the photo-conductive layer and the semiconductor layer were formed independently. It is to be noted that the described embodiment eliminates the necessity for the masking which is indispensable in the conventional process for the purpose of preventing each amorphous silicon layer from being formed in the areas where the layer should not be formed. Furthermore, the degree of integration of the photo-sensor elements in the array can be increased so as to reduce the area of the substrate, because the photoelectric conversion section and the TFT seciton are formed in the close proximity of each other.

Figure 3:
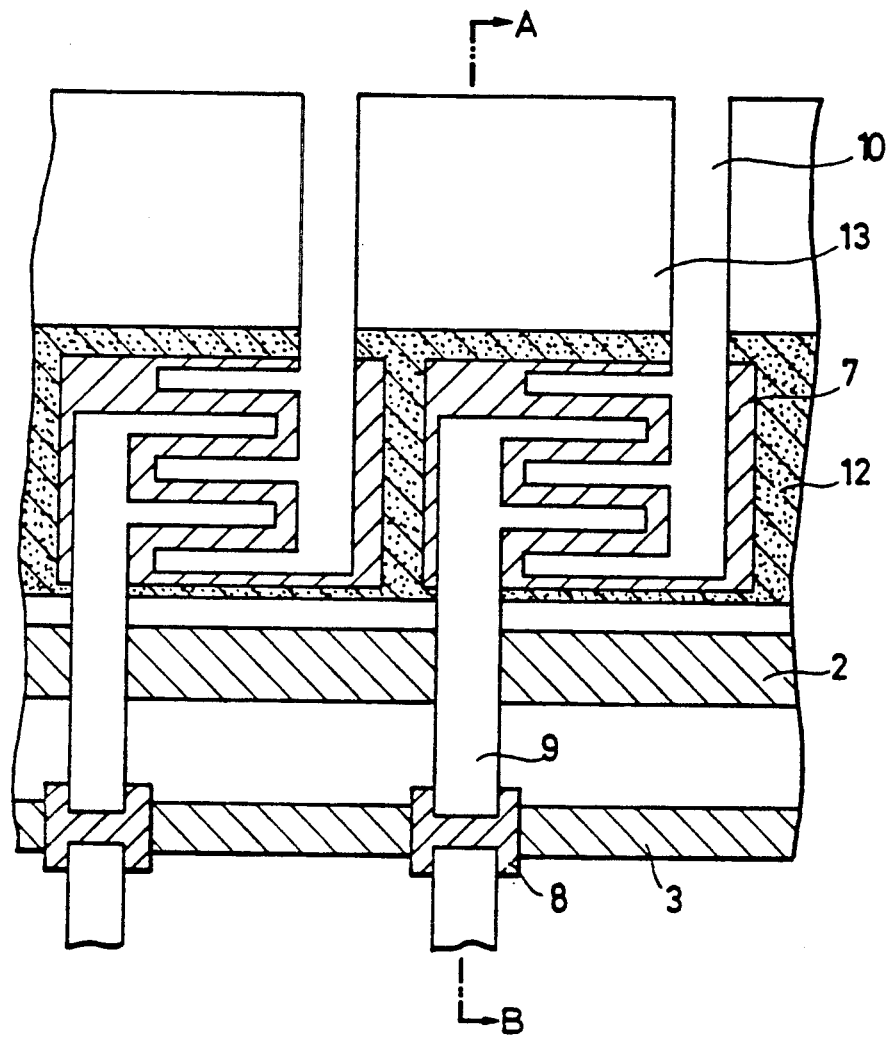
FIG. 3 is a plan view of a portion of another embodiment of the photoelectric conversion device in accordance with the present invention.
Figure 4:
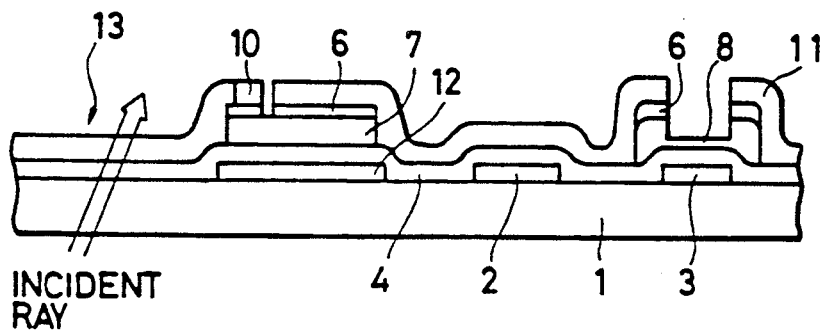
FIG. 4 is a cross-sectional view taken along the line A-B of FIG. 3.

FIG. 3 is a plan view of a portion of the photo-sensor array in another embodiment of the present invention, while FIG. 4 is a sectional view taken along the line A-B of FIG. 3. This embodiment has a light shielding film 12 and a light incident film 13. Other portions are materially the same as those in the first embodiment and are denoted by the same reference numerals as those used in FIGS. 1A and 1B.

Layers of Al and Cr are formed on the glass substrate 1 in the same way as that in the first embodiment. Then, the underlying layer 2 of capacitor, gate electrode 3 and the light shielding film 12 are formed by photo-lithographic method. Then, the same steps as the first embodiment are followed so that the photo-sensor array shown in FIGS. 3 and 4 are formed.

The photo-sensor array of this embodiment is an original-contact type sensor which does snot make use of any refraction distribution type rod lens array. As shown in FIG. 4, the incident light comes from the underside of the glass substrate and impinges upon the photoconductive layer 7 after being reflected from the surface of an original (not shown) placed on the photo-sensor. The light shielding film 12 is intended for preventing incident light form coming into the photoconductive layer from the underside thereof. This embodiment offers, besides the advantages derived from the first embodiment, an advantage in that the sensitivity of the photo-sensor is increased by virtue of the fact hat the light which has impinged upon and passed through the photoconductive layer is reflected by the Al layer.

As will be understood from the foregoing description, in the first and the second embodiments of the invention, the number of steps in the production step is remarkably decreased by virtue of the fact that the photoconductive layer of the photoelectric conversion layer and the semiconductor layer of the TFT are formed by the same amorphous silicon layer. In addition, since the photoelectric conversion section ad TFT portion are formed in the close proximity of each other, the degree of integration of sensor elements if increased so as to realize a reduction in the size of the sensor array and a remarkably decrease in the substrate area.

FIGS. 5A to 5F are sectional views illustrating steps of a process for producing a photo-sensor array shown in FIG. 2 as still another embodiment of the present invention. FIGS. 5A to 5F are sectional views taken along the line X-Y of FIG. 2.

Figure 5A:
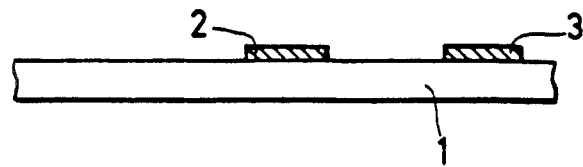
FIGS. 5A to 5F are cross-sectional views of different steps of a process for producing an embodiment of the present invention.

In this process, glass substrate 1 (Coning No. 7059) polished at both surfaces is cleaned with an ordinary neutral detergent or an organic alkali detergent. Then, Cr is deposited to a thickness of $0.15\mu$ by electron beam evaporation deposition method. Then, a photo-resist pattern of a desired shape is formed by using a posi-type photo-resist (AZ-1370 made by Sibure). Subsequently, the unnecessary Cr is removed by an aqueous solution of a mixture of ammonium secondary cerium nitrate and perchloric acid, so as to form the underlying electrode 2 of capacitor and the gate electrode 3, as shown in FIG. 5A.

Figure 5B:
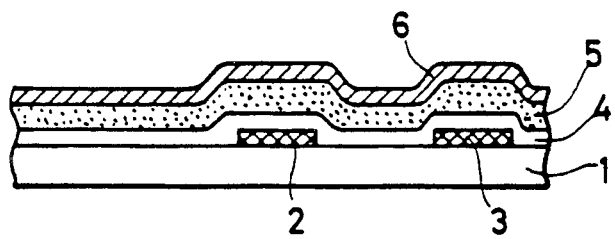

Subsequently, the glass substrate 1 is placed in a glow discharge decomposition apparatus of capacitance coupling type so as to held in a vacuum atmosphere of a pressure of $1 \times 10^{-6}$ Torr at 230° C. Subsequently, SiH$_4$ diluted to 10% by H$_2$ and NH$_3$ are simultaneously supplied into the apparatus as flow rates of 5 SCCM and 20 SCCM, respectively. Then, a glow discharge is effected for 2 hours at RF (radio frequency) discharge power of 15W, using a high-frequency power supply of 13.56 MHz, so as to form an insulating layer 4 of silicon nitride to a thickness of $0.3\infty$. Then, SiH$_4$ gas is supplied at a flow rate of 10 SCCM, and glow discharge is effected for 2.5 hours with discharge power of 8W and gas pressure of 0.07 Torr so as to form an amorphous silicon intrinsic layer to a thickness of $0.50\mu$. Then, an n+ layer 6 constituting an ohmic contact layer is deposited to a thickness of $0.12\mu$ as shown in FIG. 5B, using as the material a gas composed of SiH$_4$ diluted by H$_2$ to 10% and PH$_3$ diluted by H$_2$ to 100 ppm mixed at a ration of SiH$_4$:PH$_3$=1:10, with a discharge power of 30W.

Figure 5C:
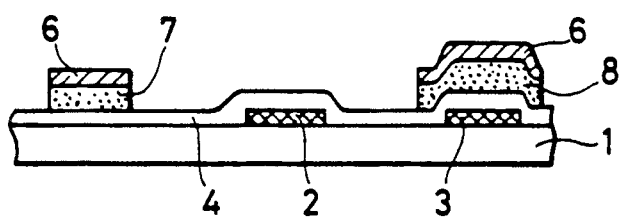

Subsequently, a desired pattern is formed by using a posi-type photo-resist (OFPR-1300 made by Tokyo Ouka Kogyo), and a dry etching by plasma etching method is conducted with CF$_4$ gas of a pressure of 0.30 Torr. and an RF discharging power of 100W, so as to remove the unnecessary portions of the n+ layer and the intrinsic layer of amorphous silicon, theory forming amorphous silicon photoconductive layer 7 and a semiconductor layer 8, as shown in FIG. 5C.

Figure 5D:
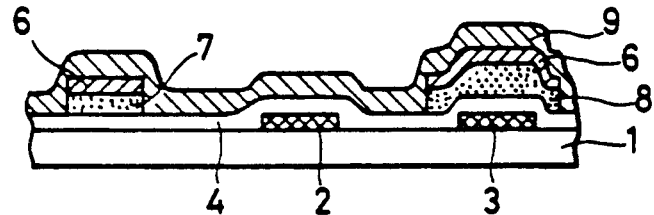

Then, Al is deposited by electron beam deposition method to a thickness of $0.5\mu$ so as to form a conductive layer, as shown in FIG. 5D.

Figure 5E:
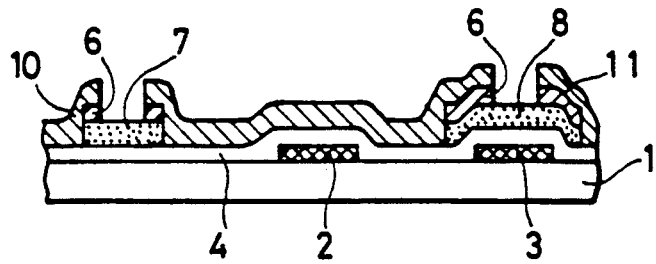
Figure 5F:
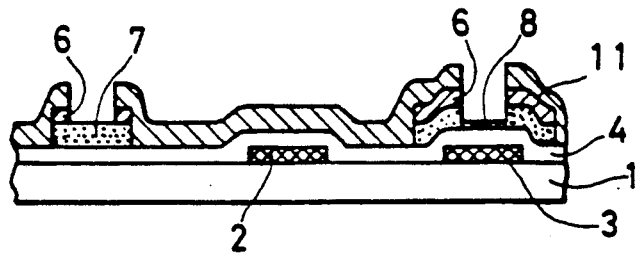

Then, after forming a photo-resist pattern into a desired form, exposed portions of the conductive layer 9 are removed by a mixture constituted by phosphoric acid (85 vol. % aqueous solution), nitric acid (60 vol. % aqueous solution), glacial acetic acid and water which are mixed at a volumetric ratio of 16:1:2:1, thereby forming a common electrode 10 and signal deriving lines 11. Subsequently, dry etching is conducted by plasma etching method using a CF$_4$ gas, so as to remove unnecessary portion of the n+ layer, thereby forming an n+ layer of the desired pattern. Subsequently, the photo-resist is separated as shown in FIG. 5E. Finally, a photo-resist is formed in a desired pattern so as to form a photo-resist of a desired pattern, and the amorphous silicon semiconductor layer 8 of the TFT section is plasma-etched so that the semiconductor layer 8 has a reduced thickness of $0.2\mu$, as shown in FIG. 5F.

FIG. 2, shows a portion of the photo-sensor array formed by the process explained above The photo-sensor of this embodiment remarkably reduces the number of steps of the production process as compared with conventional photo-sensor array because the photoconductive layer and the semiconductor layer of the TFT are formed on the same amorphous silicon layer. It is to be noted that the described embodiment ensures a high performance of the photosensor, though improvement in the sensitivity of the photoelectric conversion section and through increase in the OFF resistance of the TFT section, by virtue of the fact that the thicknesses of the amorphous silicon photoconductive layer 7 and the semiconductor layer 8 can be optimized. Furthermore, the degree of integration of the photo-sensor elements in the array can be increased so as to reduce the area of the substrate, because the photoelectric conversion section and the TFT section are formed in the close proximity of each other.

Figure 6A:
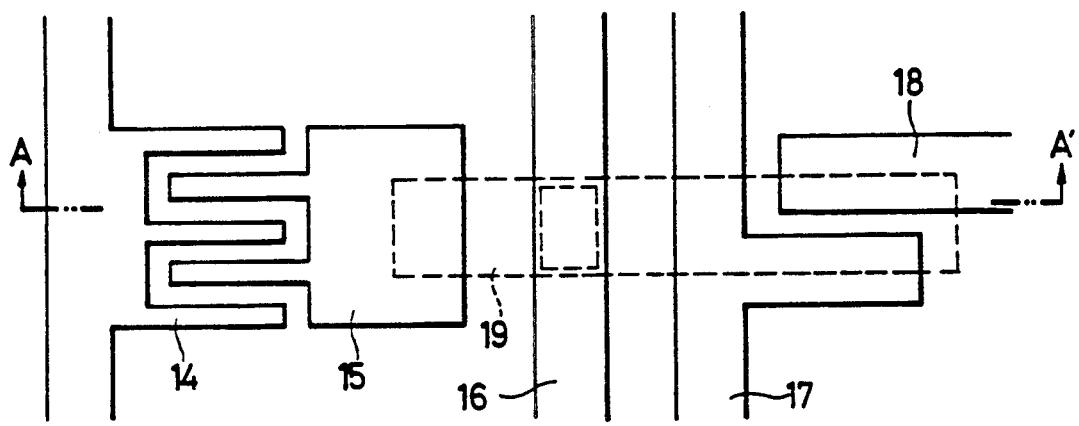
FIG. 6A is a plan view of still another embodiment of the photoelectric conversion device in accordance with the present invention.
Figure 6B:
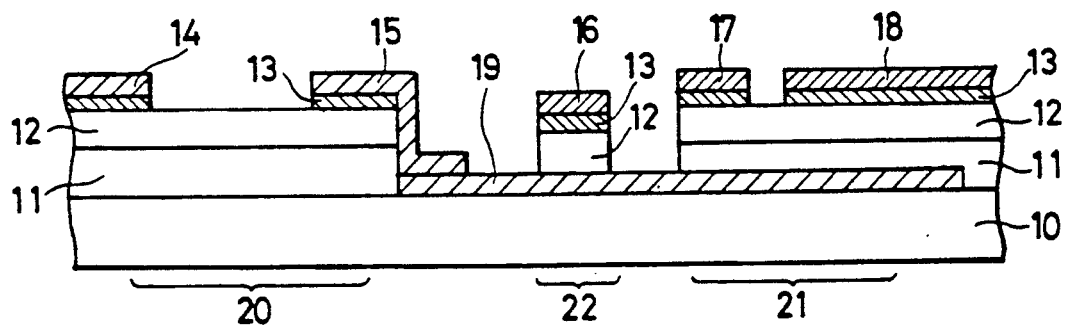
FIG. 6B is a vertical sectional view taken along the line A-A' of FIG. 6A.

FIGS. 6A and 6B show still another embodiment of the photoelectric conversion device in accordance with the present invention. More specifically, FIG. 6A is a plan view, while FIG. 6B is a sectional view taken along the line A-A' of FIG. 6A.

Referring to these Figures, a gate electrode 19, and an insulating film 11 of silicon nitride (SiNx:H) or silicon oxide (SiO$_2$) are formed on a glass substrate 10. In addition, a semiconductor layer 12 such as of amorphous silicon (a-Si) and an n+ layer 13 constituting an ohmic contact layer are formed in sequence on the insulating layer 11. On the n+ layer 13, further formed are electrodes 14, 15 of the photoelectric conversion section 20, source and drain electrodes 17, 18 of a TFT section 21, and a grounding electrode 16 of a series resistance section 22. The electrode 15 of the photoelectric conversion section 20 is connected to the gate electrode 19 of the TFT section 21, and the gate electrode 19 is connected to the series resistance section 22. In this embodiment, the insulating film 11 of the TFT section 21, semiconductor layer 12 and the n+ layer 13 are formed simultaneously, so that the number of the steps in the production process can be reduced.

Figure 7:
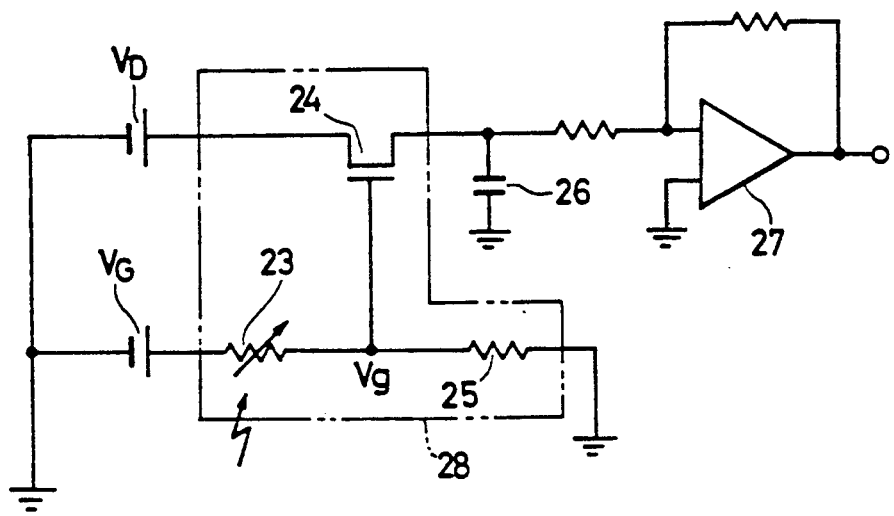
FIG. 7 is a diagram of an equivalent circuit of the photoelectric conversion device shown in FIGS. 6A and 6B.

FIG. 7 is a diagram showing an equivalent circuit of the photoelectric conversion section. The photoelectric conversion device 28 is shown in the area surrounded by broken lines. The photoelectric conversion element 23 corresponds to the photoelectric conversion section 20, while the TFT 24 corresponds to the TFT section 21. Similarly, the resistance 25 corresponds to the resistance section 22. The photoelectric conversion element 23 is connected at its one end to the gate electrode of the TFT transistor 24 and also to one end of the series resistance 25. The series electrode 25 is grounded at its other end. Voltages $V_G$ and $V_D$ are applied to the other end of the photoelectric conversion element 23 and the source electrode of the TFT 24. A capacitor 26 for accumulating charges and an amplifier 27 are connected to the drain electrode of the TFT 24.

The operation of the photoelectric conversion device of this embodiment will be explained with reference to the equivalent circuit shown in FIG. 7.

Representing the conductances of the photoelectric conversion element 23 and the series resistor 25 by $G_1$ and $G_2$, respectively, the potential $V_g$ of the gate electrode is expressed as follows.

$$V_g = \frac{G_1}{G_1 + G_2} V_G \; (V_G > 0)$$

When light impinges upon the photoelectric conversion element 23, the conductance $G_1$ is increased as compared with that before the light is received, so that the voltage $V_g$ of the gate electrode of the TFT 24 also is increased. That is, the optical signal applied to the photoelectric conversion element 23 is converted into electric signals and is amplified by the TFT 24. The thus amplified electric signal is accumulated in the capacitor 26 and is further amplified by the amplifier 27.

Figure 8:
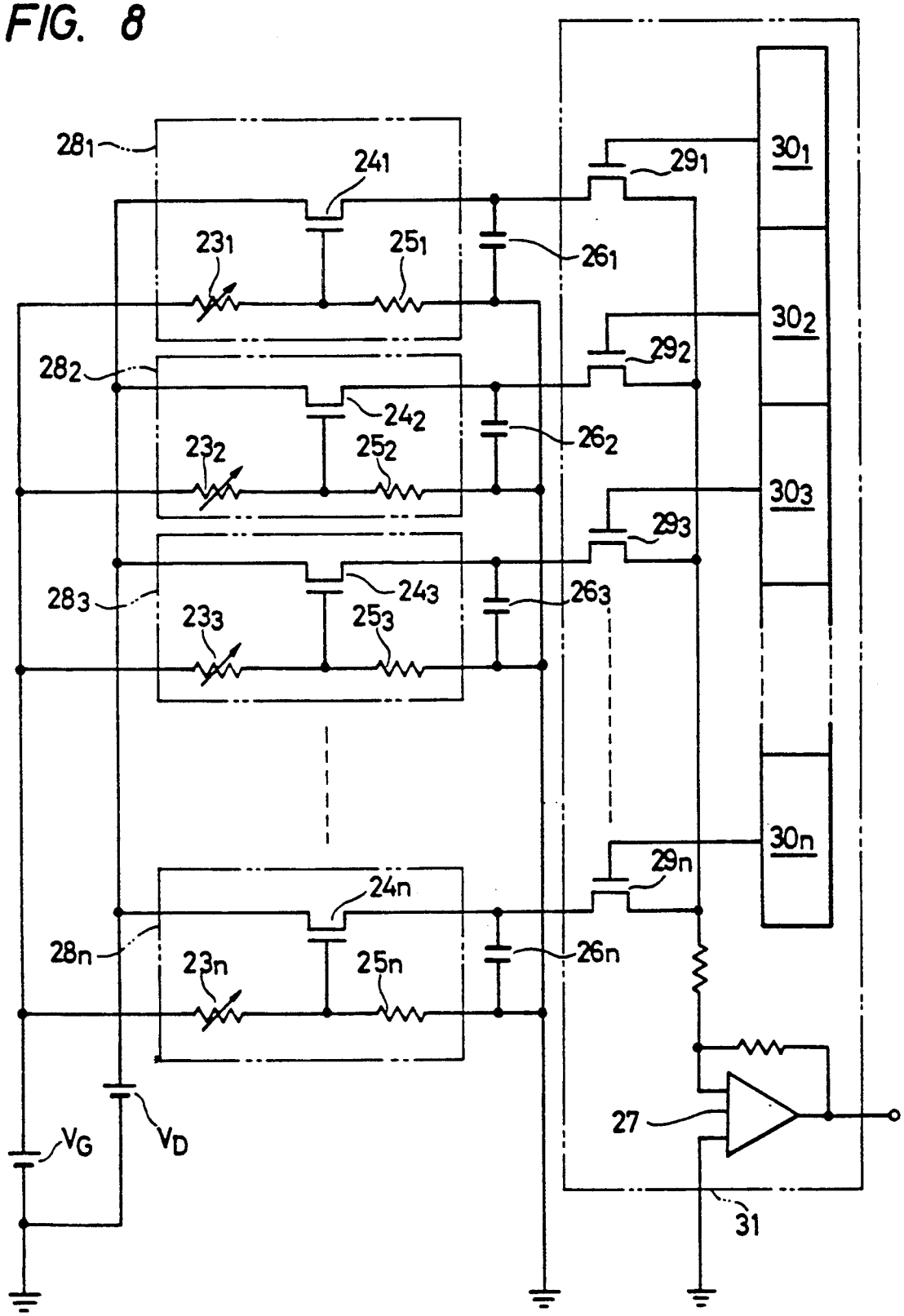
FIG. 8 is an illustration of a line sensor incorporating the embodiment shown in FIGS. 6A and 6B.

FIG. 8 shows a line sensor as an application of the photoelectric conversion device described above. In this Figure, the same reference numerals are used to denote the same parts as those in the equivalent circuit shown in FIG. 7, and description of such parts is omitted for the purpose of simplification of explanation.

Referring to FIG. 8, a charge transfer section 31 is constituted by capacitors $26_1$ to $26_n$ connected to the drain electrodes of TFTs $24_1$ to $24_n$ of the photoelectric conversion devices $28_1$ to $28_n$, transistors $29_1$ to $29_n$ for transferring the charges accumulated in the capacitors $26_1$ to $26_n$, shift registers $30_1$ to $30_n$ for sequentially operating the transistors $20_1$ to $29_n$, and an amplifier 27. Usually, the charge transfer section 31 is constructed integrally as a driving IC.

A description will be made hereinafter as to an example of the method for producing the photoelectric conversion device of this embodiment.

A glass substrate 10 (Coning No. 7059) polished at both surfaces is subjected to ordinary washing by a neutral detergent. Then, Cr is deposited to a thickness of 0.05 μm by sputtering, and a photo-resist pattern of a desired form is formed by using a posi-type photo-resist (OFPR-800 produced by Tokyo Ouka Kogyo). Subsequently, the gate electrode 19 of the TFT is formed by using an aqueous solution of a mixture of ammonium secondary cerium nitrate and perchloric acid. After removal of the photo-resist, the glass substrate 10 is placed in a glow discharge decomposing apparatus of capacitance coupling type and is maintained at 200° C. under the vacuum of $1 \times 10^{-6}$ Torr. Then, SiH$_4$ gas (furnished by Komatsu Denshi) diluted by hydrogen to 10% and NH$_3$ gas of 99.999% purity are introduced into the apparatus at rates of 100 SCCM and 50 SCCM, respectively, so as to set the gas pressure at 0.4 Torr. Then, after setting the gas pressure at 0.4 Torr, a glow discharge is conducted for 1 hour with an RF (radio frequency) discharge power of 50W, using a high-frequency source of 13.56 MHx, thus forming an SiNx:H insulating layer 11 of 3000 Å. Thereafter, a desired pattern is formed using a posi-type photo-resist and a dry etching is conducted using the photo-resist as the mask, by RIE (reactive ion etching) method under the conditions of CF$_4$ gas supply rate of 20 SCCM, gas pressure of 0.1 Torr and RF power of 100W. Subsequently, after removal of the photo-resist, a glow discharge is conducted for 3 hours under the conditions of 10% SiH$_4$ supply rate of 40 SCCM, gas pressure of 0.1 Torr and RF discharge power of 50W, thus forming a semiconductor layer 12 of, for example, amorphous silicon (a-Si) having a thickness of 5000 Å. Subsequently, a glow discharge is carried out for 1 hour by introducing 10% SiH$_4$ at a rate of 40 SCCM and PH$_3$ gas diluted to 100 ppm by hydrogen and under the conditions of a gas pressure of 0.2 Torr, and RF discharge power of 200W, thus forming an ohmic contact n+ layer 13 having a thickness of 100 Å. Then, a desired form of photo-resist pattern is formed with a posi-type photo-resist and a dry etching is conducted using the photo-resist as a mask by RIE (Reactive Ion Etching) method, under the condition of CF$_4$ gas supply rate of 20 SCCM, gas pressure of 0.1 Torr, and RF discharge power of 100W, thereby removing unnecessary portions of the n+ layer, semiconductor layer and the insulating layer. Then, Al is deposited by sputtering to a thickness of 0.5 μm and, after forming a desired form of photo-resist pattern with a posi-type photo-resist, and etching is effected with a mixture liquid constituted by phosphoric acid (85 vol. % aqueous solution), nitric acid (60 vol. % aqueous solution), glacial acetic acid and water which are mixed at a volumetric ratio of 16:1:2:1, thereby forming the desired pattern.

Subsequently, after removal of the photo-resist, the unnecessary portion of the n+ film is removed by dry etching RIE method similar to mentioned before, so that the photoelectric conversion device shown in FIG. 6A was obtained.

Figure 9A:
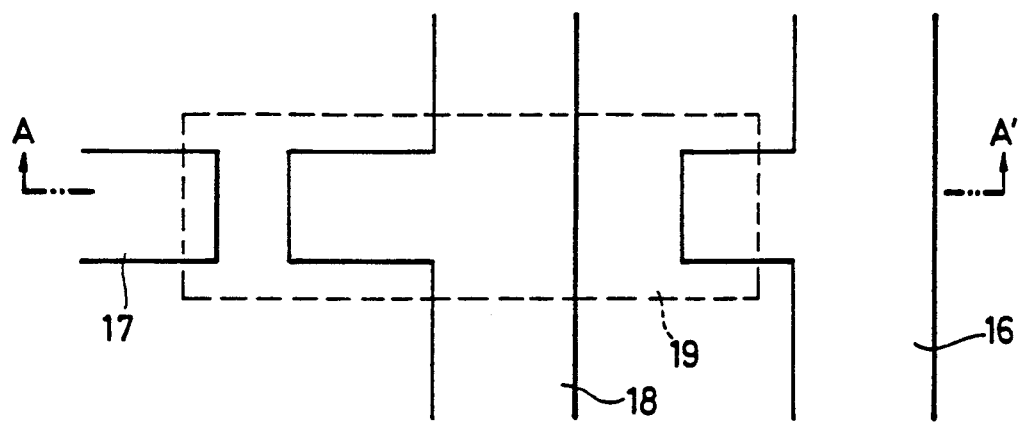
FIG. 9A is a plan view of a further embodiment of the photoelectric conversion device of the present invention.
Figure 9B:
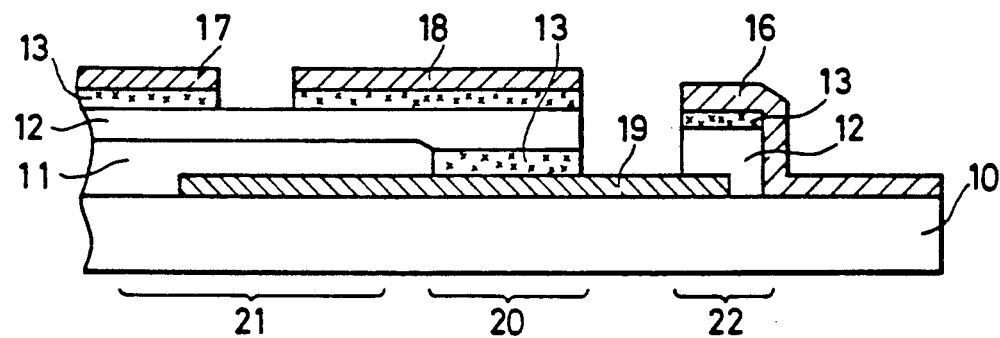
FIG. 9B is a cross-sectional view taken along the line A-A' of FIG. 9A.

FIGS. 9A nd 9B show the construction of a further embodiment of the photoelectric conversion device in accordance with the present invention. More specifically, FIG. 9A is a plan view, while FIG. 9B is a sectional view taken along the line A-A'. In these Figures, the same reference numerals are used to denote the same parts as those in the embodiment shown in FIGS. 6A and 6B.

Referring to FIGS. 9A and 9B, a transparent gate electrode such as of ITO or SnO$_2$ is formed on a glass substrate 10. An n+ layer 13 and an insulating film 11 are formed on the gate electrode 19. Then, a semiconductor layer 12 and an n+ layer 13 are formed in sequence on these layers. In this embodiment, one of the electrodes of the photoelectric conversion section 20 used also as a source electrode 18, so that the area occupied by the photoelectric conversion section can be reduced advantageously.

Figure 10:
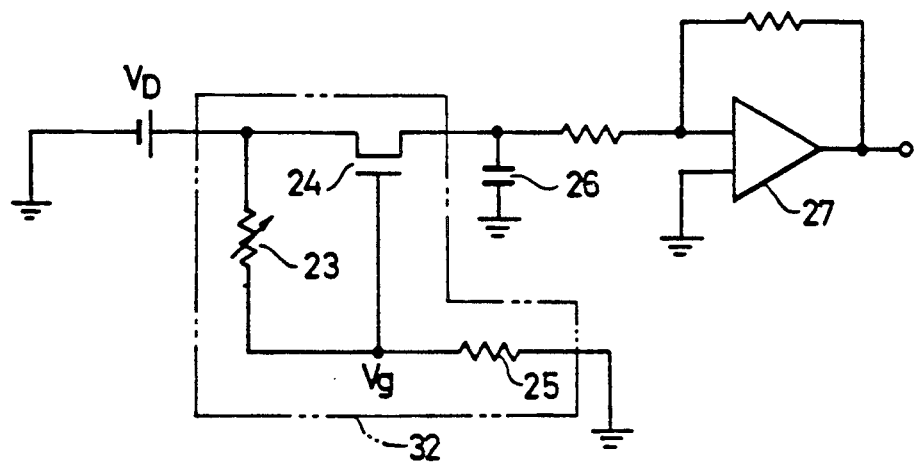
FIG. 10 is a diagram of an equivalent circuit of the photoelectric conversion device.

FIG. 10 shows an equivalent circuit of the photoelectric conversion device of this embodiment. In this Figure, the same reference numerals are used to denote the same parts as those used in the equivalent circuit diagram shown in FIG. 7, and detailed description of such parts is omitted.

As will be understood from FIG. 10, in this embodiment, a common voltage $V_D$ is applied both to one of the electrodes of the photoelectric conversion element 23 of the photoelectric conversion device 32 and the source electrode of the TFT 24. The operation of this embodiment of the photoelectric conversion device is the same as that of the processing embodiment, and can be expressed by the following formula.

$$V_g = \frac{G_1}{G_1 + G_2} V_D (V_D > 0)$$

Detailed description of operation is omitted because it is substantially the same as that of the preceding embodiment.

A description will be made hereinunder as to an example of the process for producing this embodiment of the photoelectric conversion device of the present invention.

A glass substrate 10 (Coning No. 7059) is subjected to an ordinary washing with a neutral detergent. Then, ITO is deposited to a thickness of 0.1 μm by sputtering. After forming a photo-resist pattern of a desired form with a posi-type photo-resist (made of Shibure), the gate electrode 19 of the TFT is formed with the use of an aqueous solution of a mixture of hydrochloric acid and ferric chloride. Then, the n+ layer 13 constituting the ohmic contact layer is formed and a photo-resist pattern for the photoelectric conversion section is formed by using a posi-type photo-resist. Thereafter, the pattern is formed by dry etching. After removal of the photo-resist, then, the insulating film 11 of SiNx:H is formed and a pattern of this layer is formed in the same manner as that for the n+ layer 13. Subsequently, the semiconductor layer 12 of amorphous silicon (a-Si) and the n+ layer 13 are superposed in the same manner as that in the preceding embodiment. After forming a photo-resist pattern using a posi-type photo-resist (OFPR-800 produced by Tokyo Ouka Kogyo), dry etching is carried out by using this photo-resist pattern as a mask, so as to remove the unnecessary portions of the insulating film, semiconductor layer and the n+ layer on the gate electrode 19. Subsequently, the photo-resist is removed and electron beam evaporation deposition is effected so as to deposit Al to a thickness of 0.5 μm. Then, the desired electrode pattern is formed in the same manner as that in the preceding embodiment, and unnecessary portion of the n+ layer is removed by dry etching, whereby the photoelectric conversion device as shown in FIGS. 9A and 9B is obtained.

As will be understood from the foregoing description, both the embodiment explained in connection with FIGS. 6A and 6B and the embodiment explained in connection with FIGS. 9A nd 9B can remarkably reduce the number of steps of the production process because of the fact that the photoelectric conversion section and the transistor section are produced by the same film-forming steps. In consequence, the yield is improved an the production cost is lowered advantageously.

A still further embodiment of the photoelectric conversion device of the present invention will be described hereinunder with reference to FIGS. 11, 12 and 13.

Figure 11:
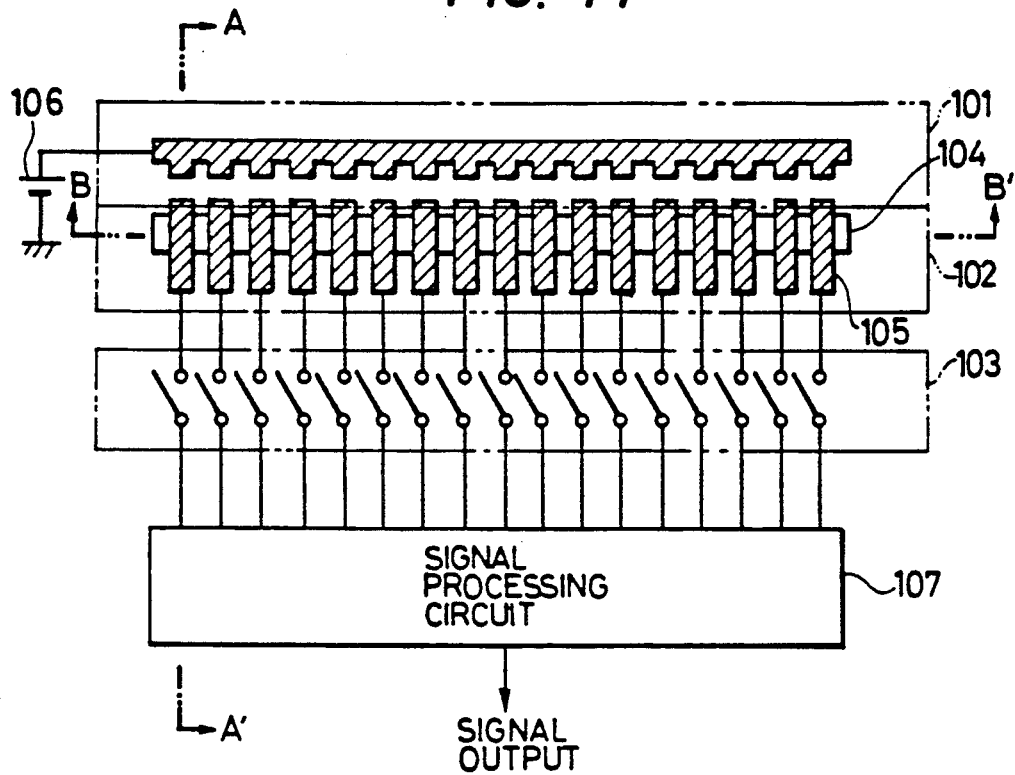
FIG. 11 is an illustration of a still further embodiment of the photoelectric conversion device in accordance with the present invention.

FIG. 11 is a schematic illustration of this embodiment of the photoelectric conversion device, while FIG. 11 is a sectional view taken along the line A-A' of FIG. 11. FIG. 13 is a sectional view taken along the line B-B' of FIG. 11.

This embodiment of the photoelectric conversion device in accordance with the present invention has a photoelectric conversion section 101, a charge accumulating section 102 corresponding to the photoelectric conversion section 101, a switch element section 103 having one end connected to the charge accumulating section 102, and a signal processing section circuit 103 connected to the other end of the switch element section 103. A reference numeral 106 is a power supply connected to the photoelectric conversion section 1. The photoelectric conversion section, the charge accumulating section 102 and the switch element section 103 are formed in accordance with the following procedure.

Figure 12:
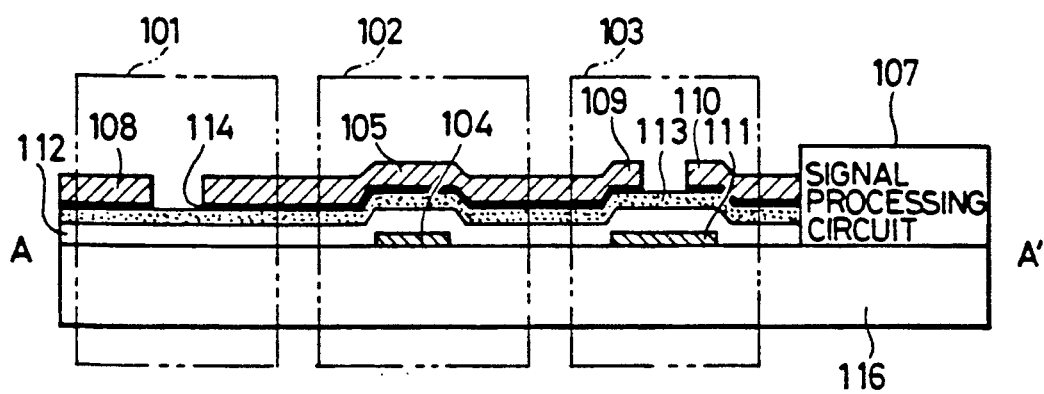
FIG. 12 is a cross-sectional view taken along the line A-A' of FIG. 11.
Figure 13:
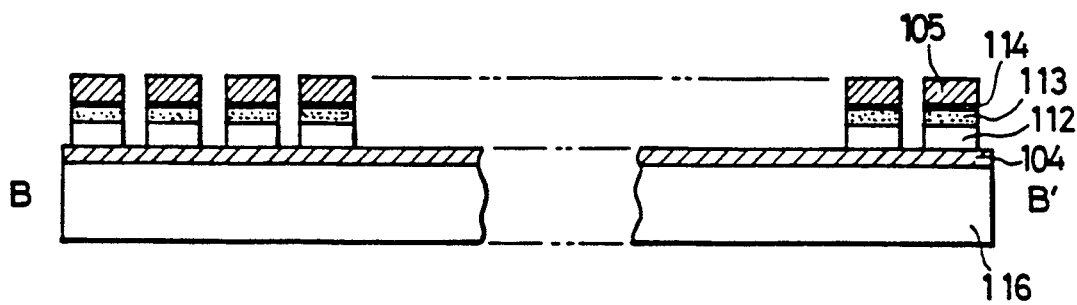
FIG. 13 is a cross-sectional view taken along the line B-B' of FIG. 11.

As shown in FIGS. 12 and 13, a common electrode 4 and the gate electrode 111 of the switch element section 3 are formed on a glass substrate 116. An insulating layer 112 is formed on the gate electrode 111 on which are formed a semiconductor layer 113 made of a photoelectric conversion material and an ohmic contact layer 114. On the ohmic contact layer 114 are formed a common electrode 108 of the photoelectric conversion section 101, independent electrodes 105 of the charge accumulating section 102 and the drain and source electrodes 109 and 110 of the switch element section 103. The semiconductor layer 113 and the ohmic contact layer 114 between the independent electrodes 105 and the common electrode 104 serve as a dielectric material, so that it is not removed by etching but remains in the charge accumulating section 102 as shown in FIG. 12. These layers, however, are divided by etching during formation of the independent electrodes 105. Therefore, there is no risk for the insulating layer 112 between the independent electrode and the common electrode 104 to be degraded due to pin holes or deformation.

In this embodiment, there is no height difference between the common electrode 108 and the independent electrode 108 in the region near the window of the photoelectric conversion section, so that the occurrence of troubles such as cutting of lines in suppressed.

The operation of this photoelectric conversion device is as follows.

Figure 17:
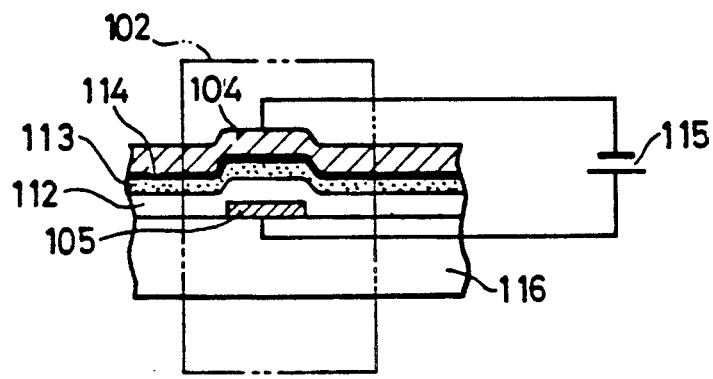
FIG. 17 is an illustration of the charge accumulating section 20.
Figure 18:
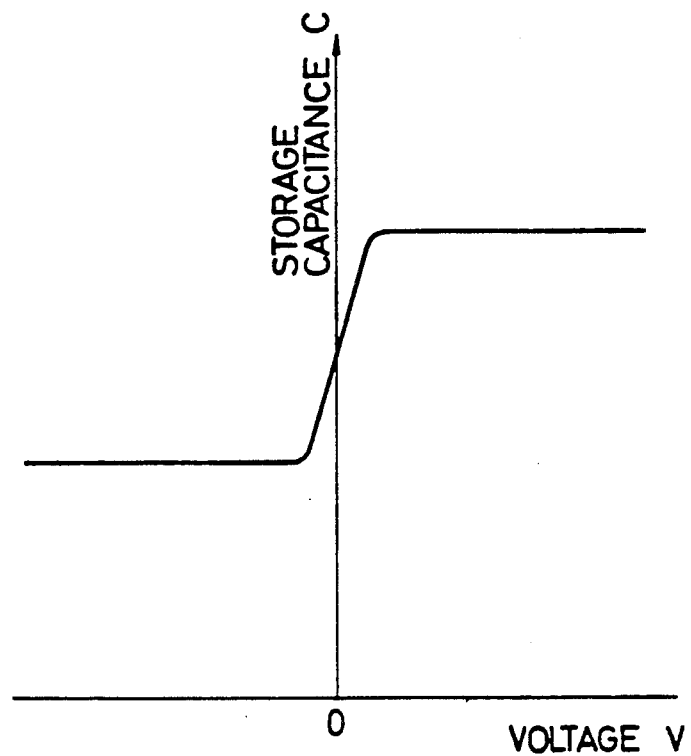
FIG. 18 is a chart showing charge accumulating capacity characteristic of the charge accumulating section 20.

FIG. 17 is an illustration of the operation of the charge accumulating section in this embodiment, while FIG. 18 shows charge accumulating characteristic of the same.

As the photoelectric conversion section 101 is irradiated with light, a voltage is applied to the common electrode 108, so that the conductivity is increased in the region of the window in the semiconductor layer 113, so that charges are accumulated in the independent electrodes 105 of the charge accumulating section 102. Then, the power supply 115 is connected between the independent electrode 105 and the common electrode 104 such that the potential of the common electrode 104 becomes higher, as shown in FIG. 17, and a voltage higher than a predetermined level is applied between these electrodes 104 and 105. As a result of the application of this voltage, the capacitance C is increased so that the charge accumulating amount can be increased. The accumulated charges are transferred to the signal processing circuit 107 when the filed effect transistor of the switch element section 103 is ON, so as to be converted into serial signal by the signal processing circuit 107 and delivered form the latter as an output.

Figure 14:
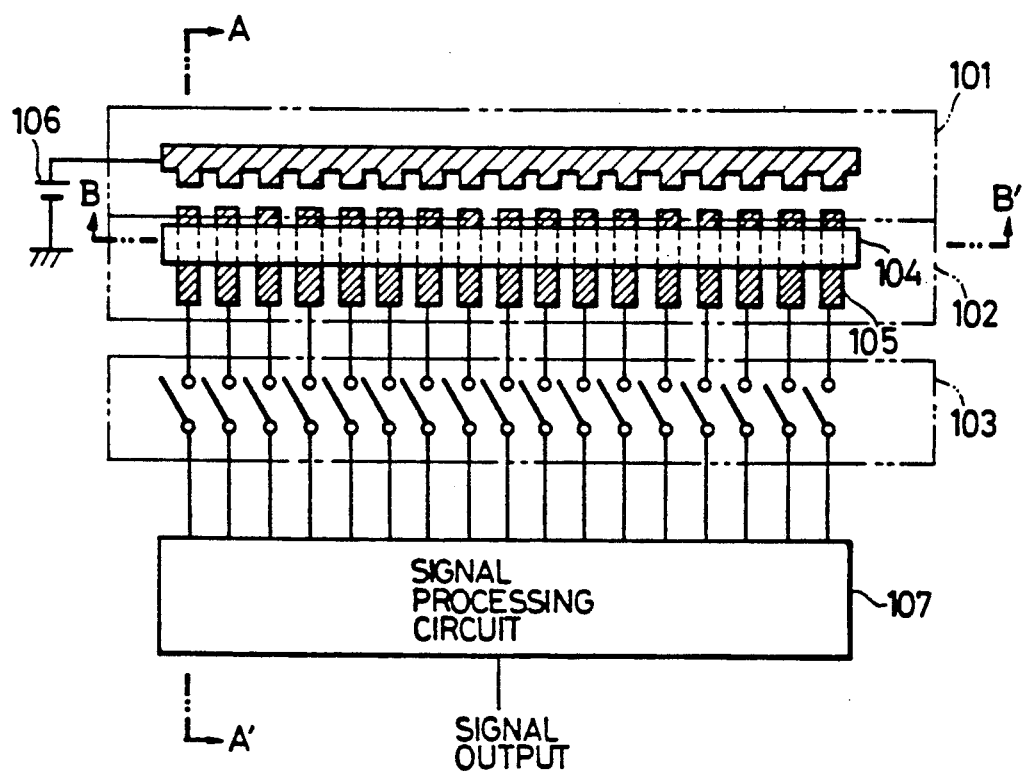
FIG. 14 is a schematic illustration of a still further embodiment of the photoelectric conversion device in accordance with the present invention.
Figure 15:
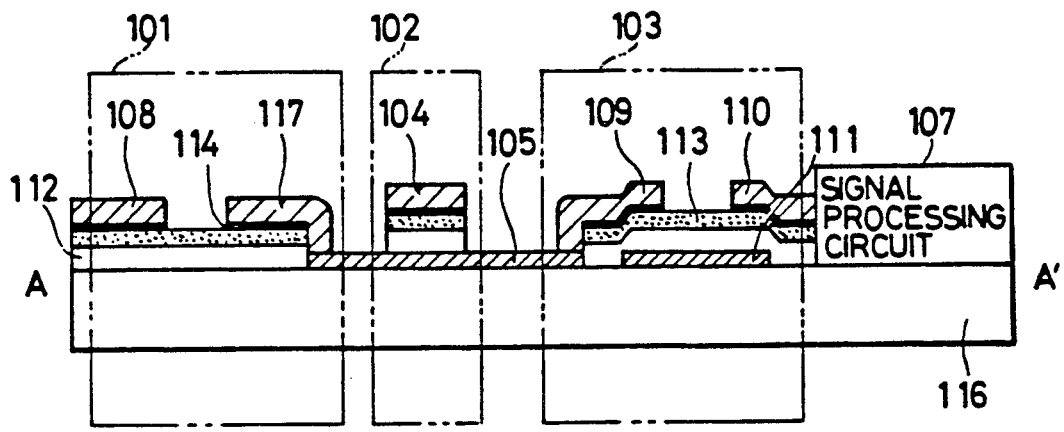
FIG. 15 is a cross-sectional view taken along the line A-A' of FIG. 14.
Figure 16:
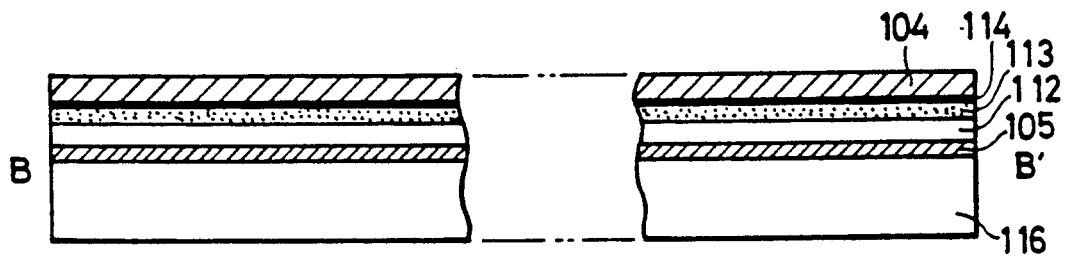
FIG. 16 is a cross-sectional view taken along the line B-B' of FIG. 14.

A still further embodiment of the photoelectric conversion device of the invention will be explained with reference to FIGS. 14, 15 and 16. More specifically, FIG. 14 is a schematic illustration of this embodiment, FIG. 15 is a sectional view taken along the line A-A' of FIG. 14, and FIG. 16 is a sectional view taken along the line B-B' of FIG. 14.

In this embodiment, the arrangement of the common electrode 104 and the independent electrodes 105 in the charge accumulating section 102 is reverse to that in the preceding embodiment shown in FIGS. 11 to 14.

In this embodiment, independent electrodes 105 of the charge accumulating section 102 an the gate electrode 111 of the switch element section 3 are formed on a glass substrate 116. Then, the insulating layer 112, the semiconductor layer 113 and the ohmic contact layer 114 are formed on the common electrode layer 105. Subsequently, portions of the insulating layer 112, semiconductor layer 113 and the ohmic contact layer 114 are removed except the portion for forming the common electrode. Then, a process is carried out so as to form the common electrode 108 and the grounding electrode 117 of the photoelectric conversion section 101, common electrode 104 of the charge accumulating section 102, and the drain electrode 109 and the source electrode 110 of the switch element section 103. In this embodiment also, the insulating layer 112 between the independent electrodes 105 and the common electrode 104 are left without being etched, so that the same advantages as those in the preceding embodiment shown in FIGS. 11 to 13 are derived also from this embodiment.

In these two embodiment, the semiconductor layer formed on the insulating layer is the same as the semiconductor layer of the amorphous silicon which constitutes the photoelectric conversion material of the photoelectric conversion section 101. This, however, is not exclusive and the semiconductor layer on the insulating layer 112 may be provided separately from the semiconductor layer of the amorphous silicon. For instance, the semiconductor layer on the insulating layer 112 may be an amorphous silicon geranium semiconductor layer.

As will be seen form the foregoing description, in the embodiment shown in FIGS. 11 to 13 and FIGS. 14 to 16, the production process is simplified and degradation of the insulating layer during the production is avoided, by virtue of the provision of the semiconductor layer on the insulating layer on at least the charge accumulating section. In consequence, any tendency for the accumulating capacity and the photoelectric conversion characteristic to fluctuate is remarkably suppressed.

Figure 19:
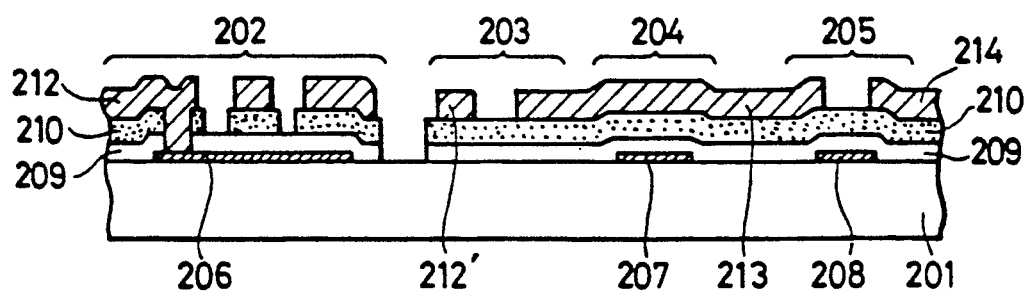
FIG. 19 is a cross-sectional view of a line sensor as a still further embodiment of the photoelectric conversion device in accordance with the present invention.

FIG. 19 is an embodiment of the line sensor as a photoelectric conversion device in accordance with the present invention. Referring to this Figure, a substrate 201 has a lower electrode wiring 206 of a wiring section 202, a lower electrode wiring 207 of a charge accumulating section 204, and a lower electrode wiring 204 constituting the gate electrode of a switch element section 205. An insulating layer 209 is formed on these lower electrode wirings 206, 207 and 208 and the portions of the substrate 201 between these wirings 206, 207 and 208. A photoelectric semiconductor layer 210 is formed on the insulating layer 209. Portions of the insulating layer 209 and the photoconductive semiconductor layer 210 on the wiring section 202 are provided with apertures for the purpose of connection. Upper electrode wirings 212, 213 and 214 are formed on the photoconductive semiconductor layer 210. The opened area between the upper electrode wiring 212 an the upper electrode wiring 213 constitutes the photoelectric conversion region of the photoelectric conversion section 203. The upper electrode wiring 213, photoelectric semiconductor layer 210, insulating layer 209, and the lower electrode wiring 207 in combination constitute a charge accumulating capacitor, while the end of the upper electrode wiring 213 adjacent to the switch 205 constitutes a drain electrode. On the other hand, the end of the upper electrode wiring adjacent to the switch section 205 constitutes a source electrode. Although not shown, a doping layer is formed between the upper electrode wirings 212, 213, 214 and the photoconductive semiconductor layer 210, so that an ohmic contact is achieved therebetween. In the described embodiment of the invention, each of the wiring section 202, photoelectric conversion section 203, charge accumulating section 204 and the switch section 205 is provided with the insulating layer 209 and the photoconductive semiconductor layer 210. These layers for the sections 202 to 250 are formed in the same steps of process.

In the wiring section 202, the photoconductive semiconductor layer 210 exists besides the insulating layer 209, between the lower electrode wiring 206 and the upper electrode wiring 212. The presence of the semiconductor layer 212, however, does not produce any unfavorable effect because it is necessary only that a sufficient insulation is provided between the lower electrode wiring 206 and the upper electrode wiring 212.

The photoelectric conversion section 203 employs the photoconductive semiconductor layer 210 formed on the substrate 1 through the intermediary of the insulating layer 209. The presence of the photoconductive semiconductor layer 210 appears as a change in the energy level of the interface between the photoconductive semiconductor 210 an the insulating layer 209. This, however, does not cause any change which would impair the basic performance of the photoconductive material. In this case, it is possible to provide an electrode between the substrate 201 of the photoelectric conversion section 203 and the insulating layer 209 so as to control and optimize the energy level at the inter-surface of the photoconductive semiconductor layer 210.

In the charge accumulating section 204, a photoconductive semiconductor layer 210 provided on the insulating layer 209 affects the charge accumulating capacity. This effect has a dependency on bias of the capacitance. Thus, the electrostatic capacitance is changed in accordance with the degree of band being of the semiconductor layer at the interface of the insulating surface. In the charging and discharging operation in this embodiment, however, the bias-dependency can be reduced to a negligible level by applying a negative bias to the electrode adjacent to the insulating layer 209.

The thickness of the photoconductive semiconductor layer 210 is selected such as to provide superior photoelectric conversion characteristic of the photoelectric conversion section 203 and the switching characteristic of the switch section 205.

A description will be made herein under as to the case where the switch section of the line sensor is constituted by a matrix switch array.

Figure 20:
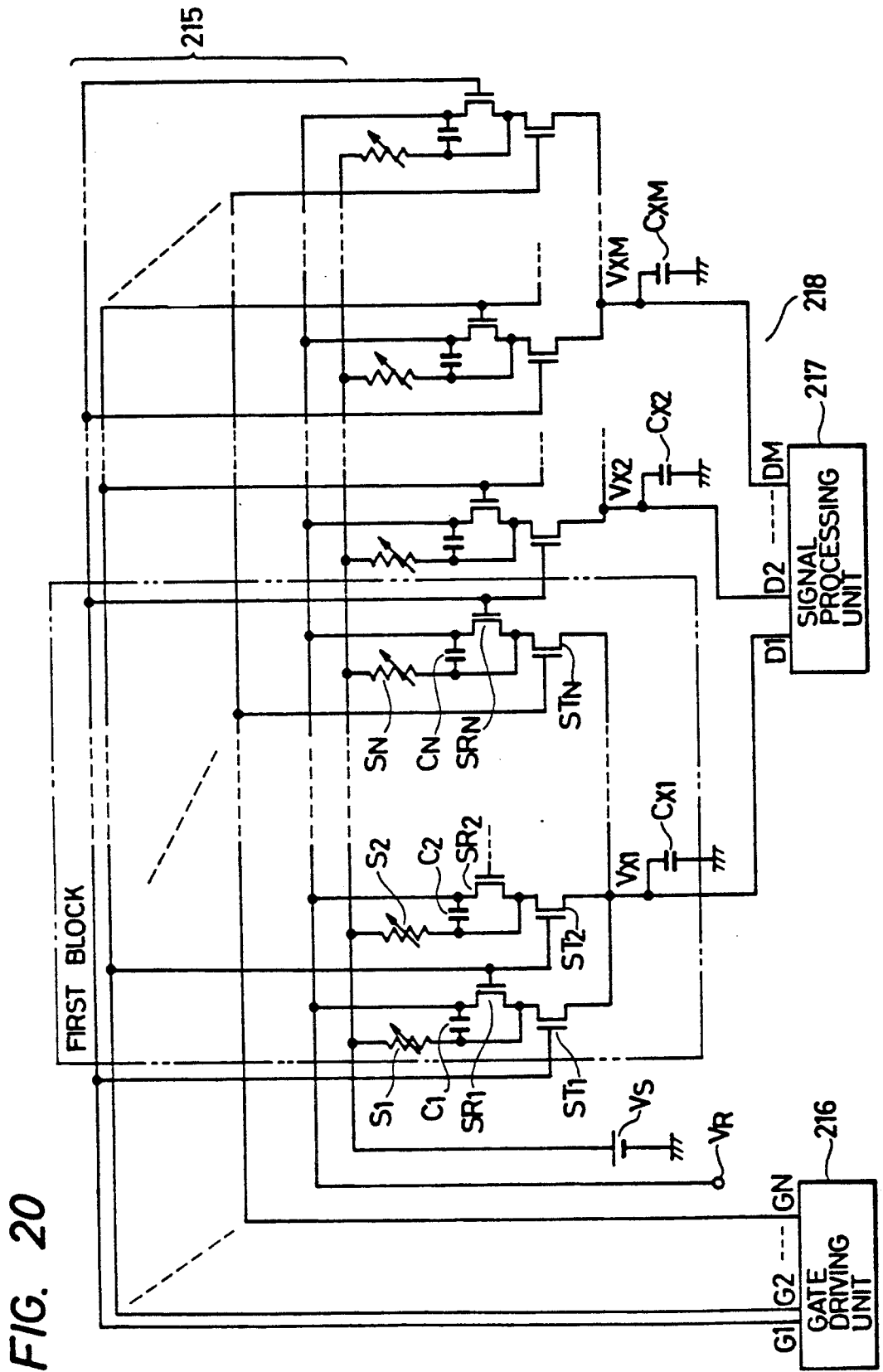
FIG. 20 is a diagram showing an equivalent circuit of a line sensor having a matrix array.

FIG. 20 shows an equivalent circuit of a line sensor having a matrix switch array. In this Figure, S1, S2, . . ., Sn (represented by SY1, hereinafter) denote photosensor which correspond to the photoelectric conversion section 203, charge accumulating capacitors C1, C2, . . ., CN (represented by CY1, hereinafter) corresponding to the charge accumulating section 204 and adapted for accumulating photo-currents in the photosensors SY1. ST1, ST2, . . ., STN (represented by STY1, hereinafter) represent transfer switches for transferring the charges from the accumulating capacitors CY1 to the load capacitors CX1. SR1, SR2, . . ., SRN (represented by SR1, hereinafter) are discharge switches for resetting the charges of the accumulating capacitor CY1. In this example, the switch section 205 is composed of a transfer switches STY1 and the discharging switches SRY1.

The photosensors SY1, accumulating capacitor CY1, transfer switches STY1 and the discharge switches SRY1 are arranged in respective arrays and sectioned into N×M blocks. The gate electrodes of the transfer switches STY1 and discharge switches SRY1 arranged in arrays are connected to a matrix wiring section 215. The gate electrodes of the transfer switches STY1 of each block are connected commonly to the gate electrodes of the transfer switches of corresponding orders of other blocks. On the other hand, the gate electrodes of the discharge switches SRY1 are connected to the gate electrodes of the transfer switches of next orders in each block.

The common lines (gate driving lines G1, G2, . . . , GN) of the matrix wiring section 215 are driven by the gate driving section 216. On the other hand, the output signals are delivered to a signal processing section 217 through signal deriving lines 218 (signal output lines D1, D2, . . . , DN).

Figure 21:
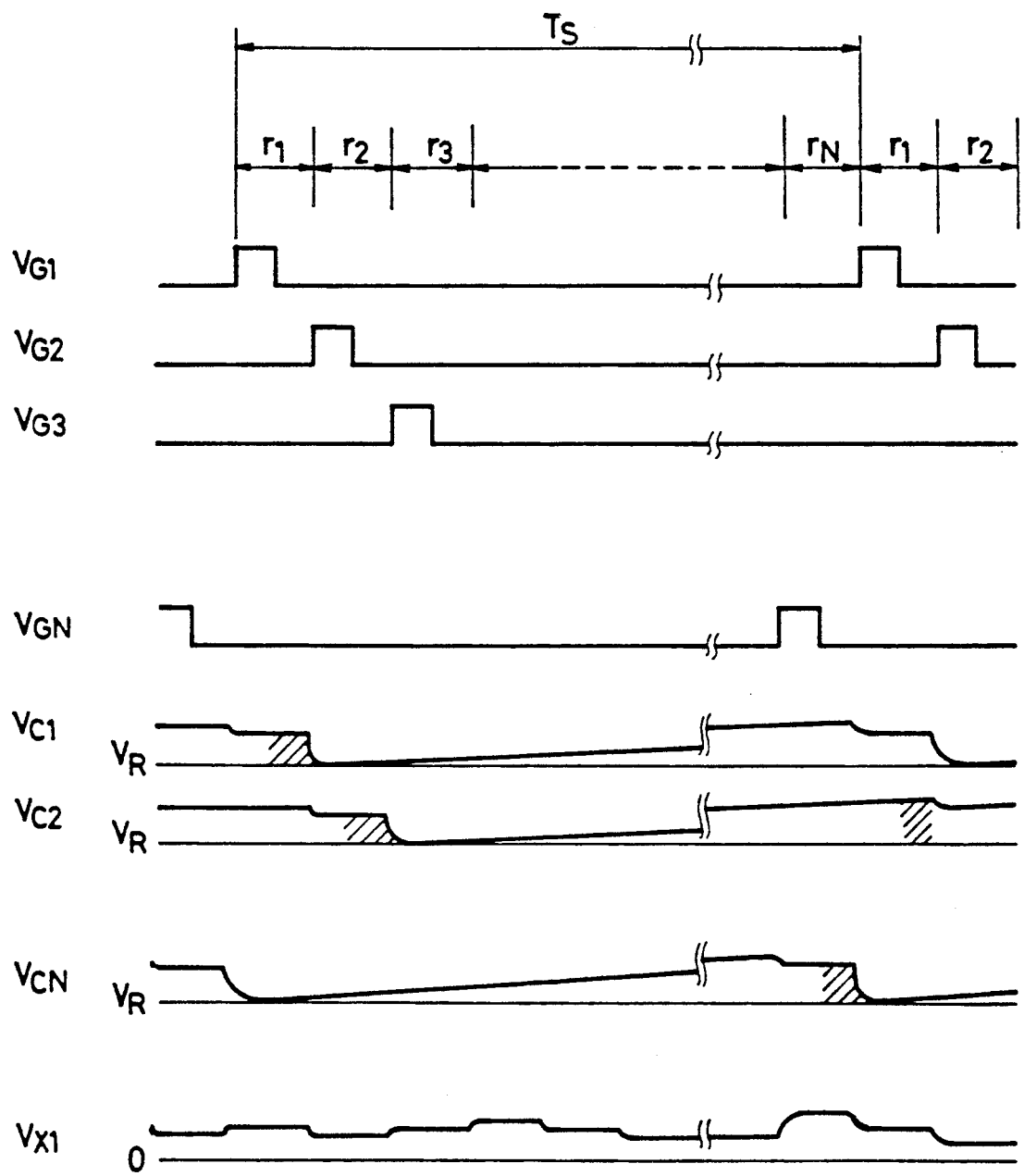
FIG. 21 is a timing chart illustrating the operation of the line sensor.

FIG. 21 is a timing chart illustrating the operation of the line sensor described above.

Selection pulses (VG1, VG2, VG3, . . . , VGN) are applied successively to the gate driving lines (G1, G2, . . . , GN) from the gate driving section 216. As the gate driving line G1 is selected first, the transfer switch ST1 is turned on and then the charges accumulated in the accumulating capacitor C1 are transferred to the load capacitor CX1. Then, the gate driving line G2 is selected so that the transfer switch ST2 are turned on, so that the charges accumulated in the accumulating capacitor C2 are transferred to the load capacitor CX1. At the same time, the discharge switch SR1 operates to reset the charge of the accumulating capacitor C1. Then, the gate driving lines G3, G4, . . . , GN are successively selected, thus performing reading of information. In FIG. 21, symbols VC1, VC2, . . . , VCN represent changes in the potentials of the change accumulating capacitors CY1. The above-described operation is conducted for each block, and the output signals VX1, VX2, . . . , VXN from the respective blocks are sent to inputs D1, D2, . . . , DM of the signal processing section 217 so as to be converted into serial signals. The serial signals thus formed are output from the signal processing section 217.

Figure 22:
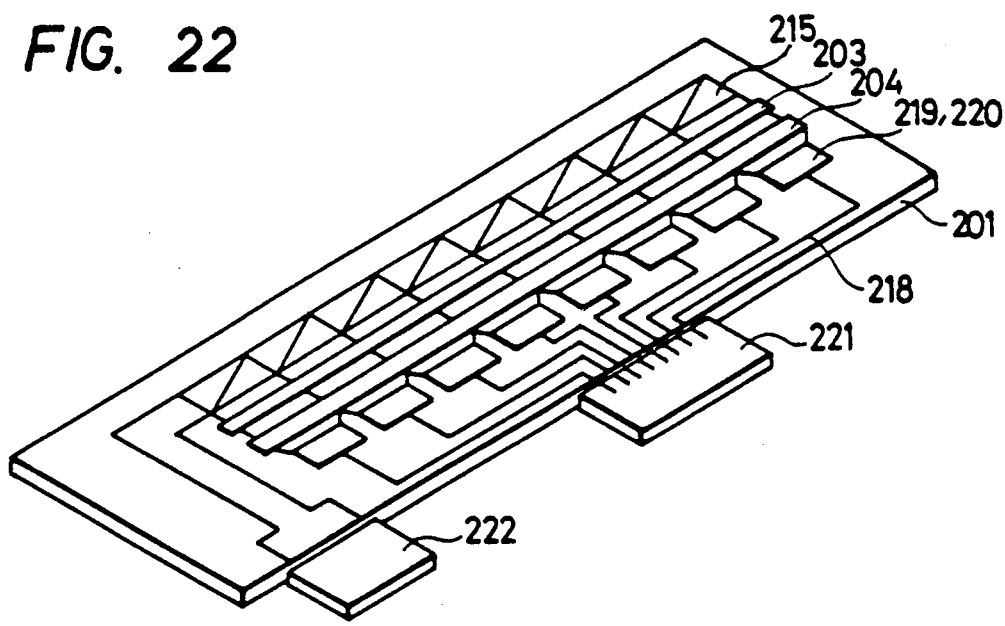
FIG. 22 is a perspective view of the line sensor.

FIG. 22 is a perspective view of the line sensor explained hereinabove.

Referring to FIG. 22, a reference numeral 201 designates a substrate on which are formed the matrix wiring section 215, photoelectric conversion section 203, charge accumulating section 204 for accumulating the charges output from the photoelectric conversion section 203, array of transfer switches 219 for transferring the charges from the charge accumulating section 204 to the signal processing IC 21, and array of discharge switches 220 for resetting the charge accumulating section 204. The transfer switches 219 and the discharge switches 220 are sectioned into N×M blocks. The rain electrodes of the transfer switches 219 are connected to corresponding charge accumulating sections, while the source electrodes in each block are connected to a common line which in turn is connected to the load capacitor (not shown) and the signal processing IC 221.

On the other hand, the gate electrodes in each block are connected to the matrix wiring section 215 such that the gate electrode lines of the same order in each block are connected commonly. The common electrode of the matrix wiring section 215 is connected to the gate drive IC 222. The signal processing IC 221 is disposed on the central portion of the substrate 201 so as to minimize the length of the deriving line 218. Shield patterns (not shown) having grounding potential are disposed in the areas between adjacent deriving lines 218.

Figure 23:
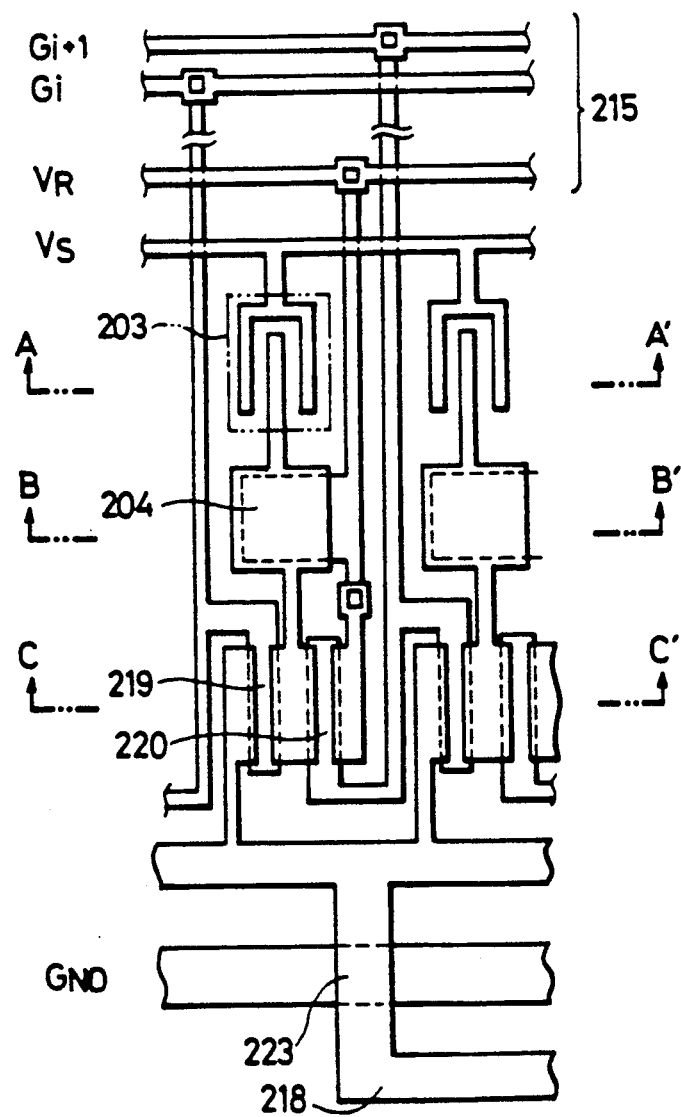
FIG. 23 is a fragmentary sectional view of the line sensor shown in FIG. 22.

FIG. 23 is a plan view of a portion of the line sensor described above. In this Figure, there are shown the matrix wiring section 215, the photoelectric conversion section 203, the charge accumulating section 204, the transfer switch 219, the discharge switch 220 for resetting the charge of the charge accumulating section 204, the deriving line 218 for connecting the signals from the transfer switch to the signal processing IC, and the load capacitor 223 for accumulating and reading the charges transferred by the transfer switches 219.

In this embodiment, amorphous silicon (a-Si:H) film is sued as the photoconductive semiconductor layer of the photoelectric conversion section 203, transfer switch 219 and the discharge switch 220. On the other hand, the insulating layer is constituted by a silicon nitride film (SiNH) formed by a glow discharge.

FIG. 23 shows, for the purpose of simplification of the drawings, only the upper and lower electrode wirings are shown, while the photoconductive semi-conductor layer and the insulating layer are omitted. The photoconductive semiconductor layer and the insulating layer are formed in each of the photoelectric conversion section 203, charge accumulating section 204, transfer switch 219 and the discharge switch 220, as well as between the upper electrode wiring and the substrate. Furthermore, an a-SiH layer doped into n+ type is formed at the interface between the upper electrode wire and the photoconductive semiconductor layer, thus providing an ohmic contact.

In the wiring pattern of the lie sensor of this embodiment, the signal lines output from all the photoelectric conversion sections are laid so as not to intersect with one another, there by preventing generation of crosstalk between the signal components and the generation of induction noises from the gate electrode wirings.

Figure 24A:
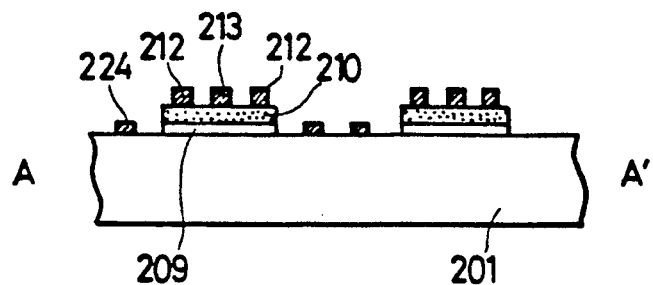
FIG. 24A to 24C are fragmentary cross-sectional views of the line sensor shown in FIG. 23.
Figure 24B:
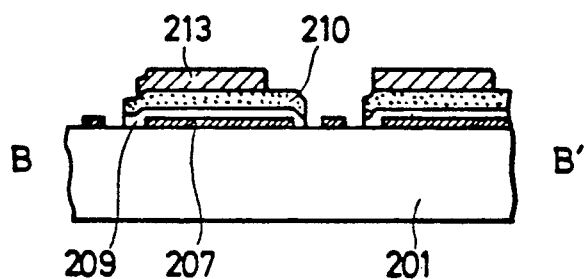
Figure 24C:
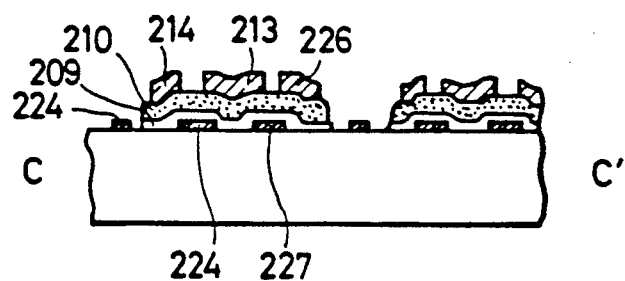

FIGS. 24A-24C are fragmentary longitudinal sectional vies of the photoelectric conversion section 203, taken along the lines A-A′, B-B′ and C-C′ of FIG. 23, respectively. Referring to FIG. 24A which is a longitudinal section of the photoelectric conversion section 203, there are shown the lower electrode wiring 224 connected to the gate electrode of the transfer switch 219, the insulating layer 209, the photoconductive semiconductor layer 210, and the upper electrode wirings 212, 213. The light impinging upon the line sensor causes a change in the conductivity of the a-Si:H layer constituting the photoelectric semiconductor layer 210, thereby causing a change in the electric current which flows between the upper electrode wirings 212, 213 which oppose in a comb-teeth form.

FIG. 24 B shows the longitudinal section of the charge accumulating section 204. As will be seen from this Figure, the charge accumulating section 204 has the lower electrode wiring 207, the dielectric structure constituted by the insulating layer 209 formed on the lower electrode wiring 207 and the photoconductive semiconductor layer 210, and the upper electrode wiring 213 formed on the photoconductive semiconductor layer 210. This charge accumulating section 4 has a structure which is the same as that of MIS (Metal- Insulator-Semiconductor) capacitor, and can be used both under positive and negative biases. It is to be noted, however, stable capacitance and stable frequency characteristic can be obtained by using the line sensor such that a negative bias is always applied to the lower electrode wiring 207.

FIG. 24C is a longitudinal sectional view of the transfer switch 219 and the discharge switch 220. As will be seen from this Figure, the transfer switch 219 is composed of the lower electrode wiring 224 constituting the gate electrode, the insulating layer 209 constituting the gate insulating layer, the photoconductive semiconductor layer 210, the upper electrode wiring 214 constituting the source electrode, and the upper electrode wiring 213 constituting the drain electrode. The gate electrode and the photoconductive semiconductor layer of the discharge switch 220 are the same layer so as the insulating layer 209 and the photoconductive semiconductor layer 210 mentioned before. The source electrode, the gate electrode and the drain electrode are constituted, respectively, by the upper electrode wiring 213, lower electrode wiring 227 and the upper electrode wiring 226. The transfer switch 219 and the discharge switch 220 in combination constitute a TFT.

As explained before, n+ layer of a-Si:H is formed between each of the upper electrode wirings 213, 214 and 226 and the photosensitive semiconductor layer 210, so as to realize an ohmic contact.

It is an ordinary measure to form a passivation film of SiNH, SiO$_2$ silicon or another organic resin is formed n an upper portion of the TFT. Such a passivation film, however, is omitted from FIG. 24C.

As will be understood from the foregoing description the line sensor of this embodiment, it possible to simultaneously form by the same process the photoelectric conversion section, charge accumulating section, transfer switch, discharge switch and the matrix wiring sections, because these sections commonly have a laminated structure constituted by a photoconductive semiconductor layer and the insulating layer.

Figure 25:
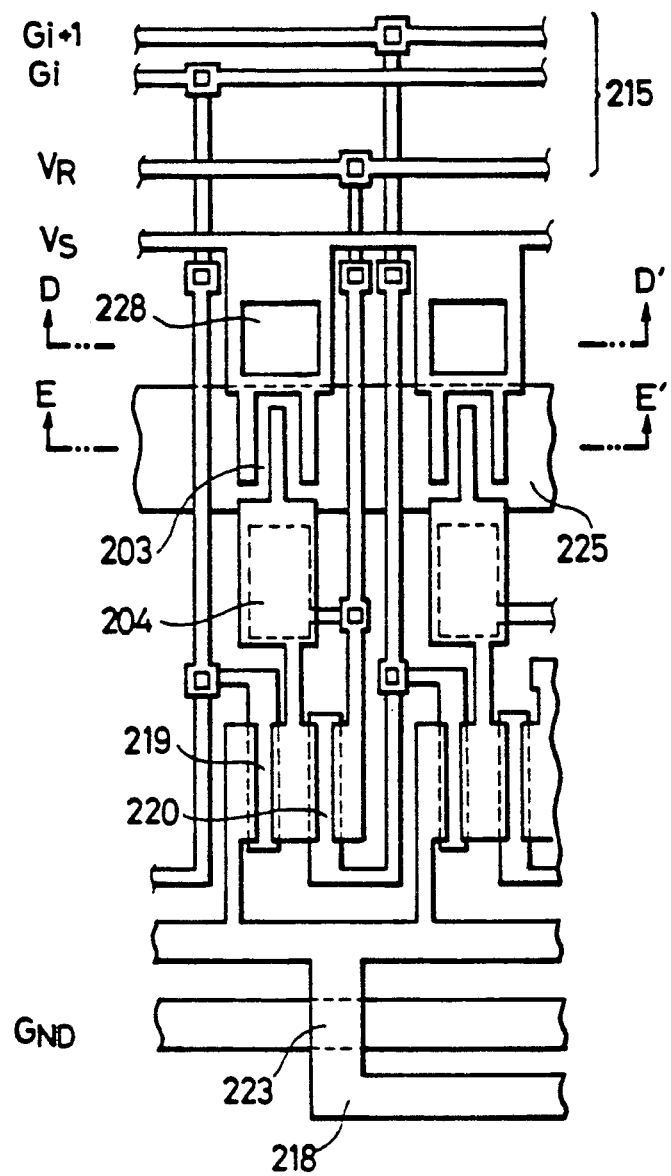
FIG. 25 is a plan vie of a portion of a line sensor as a still further embodiment of the present invention.

FIG. 25 is a plan view of a portion of a line sensor as still further embodiment of the present invention. This line sensor is sued as a so-called lens-less type photoelectric conversion device in which light impinges from the substrate-side so that the light reflected by the original held in contact with the photoelectric conversion section 203 is directly read by the photoelectric conversion section 203.

The photoelectric conversion section 230 is provided with alight shielding layer 225 for shielding the illuminating light emitting from the substrate side, as well as a window 228 through which the original is illuminated.

Figure 26A:
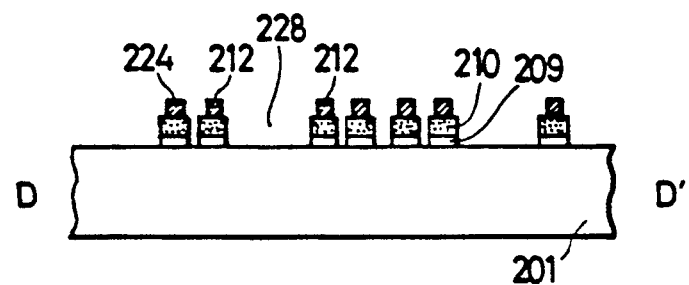
FIGS. 26A and 26B are fragmentary sectional views of the line sensor shown in FIG. 2.
Figure 26B:
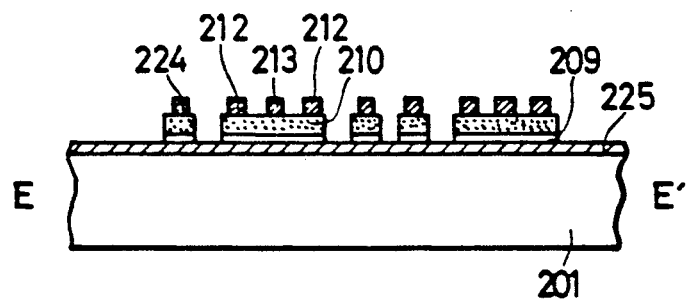

FIGS. 26A and 26B are sectional views of the line sensor shown in FIG. 25, taken along the lines D-D' and E-E' of FIG. 25.

As will be seen from this Figure, the illuminating window 228 is constituted by an opening formed in the upper electrode wiring 212. This window, however, may be formed by the lower electrode wiring.

As will be seen from FIG. 26B, the light shielding layer 225 is formed by the lower electrode wiring. Usually, a negative bias is applied to this light shielding layer 225 and the bias is controlled such as to sufficiently attenuate the dark current.

Figure 27:
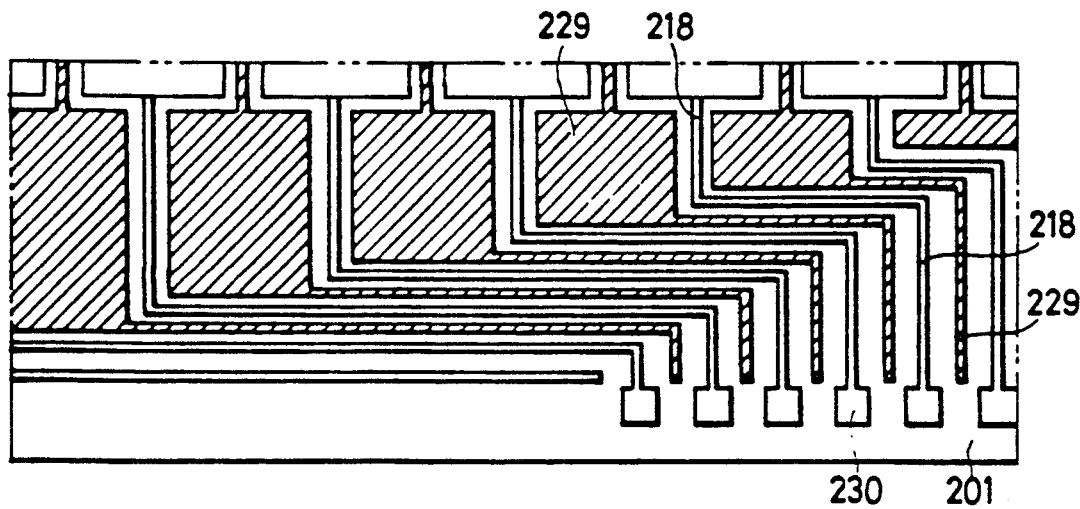
FIG. 27 is a plan view of a portion of the line sensor shown in FIG. 22, showing particularly lead lines 218.

FIG. 27 is a plan view of a portion of the deriving line 18 shown in FIG. 22.

Referring to this Figure, a ground pattern 229 is disposed between deriving lines 218 of the adjacent blocks. The ground pattern 229 effectively prevents any crosstalk which may otherwise be caused by a capacitance coupling between the adjacent deriving lines. The line capacitance formed between the deriving line 218 and the ground pattern 229 serves as a part of the load capacitor. Any difference in the capacitance due to difference in the length of the deriving lines can be eliminated by adjusting the area of the load capacitor 223, thus obtaining a substantially equal effective capacitance of the load capacitors in all the blocks. A numeral 230 designates a deriving terminal which is connected to the deriving line 218.

In this embodiment, the matrix wiring is formed by the gate electrodes of the switch section, and the source electrodes of the transfer switches in each block are merged into a common line. This arrangement, however, is not exclusive and may be modified in various forms. For instance, the matrix wiring may be formed by the source electrodes.

As will be understood from the foregoing description, in this embodiment of the photoelectric conversion device, at least the photoelectric conversion section, accumulating section and the switch section are provided with an insulating layer and a photoconductive semiconductor layer formed on the insulating layer.

This arrangement enables these sections of the photoelectric conversion device to be formed simultaneously, so that the production process can be simplified in connection with the formation of the layers and elements. In addition, this embodiment is suitable for integration because the constituent parts have a substantially identical construction, thus making it possible to obtain a small-sized photoelectric conversion device. In addition, any tendency for the insulating layer to be deteriorated during the production is suppressed, thus remarkably eliminating the risks of troubles such as short-circuiting in the capacitor section, fluctuation in the capacitance, degradation in the insulation at the crossing sections of the electrode wiring.

In consequence, this embodiment enables the photoelectric conversion device to be produced at low costs, with a higher degree of freedom of design and superior reliability.

When it is necessary to employ a laminated structure for the wiring section in the photoelectric conversion device of this embodiment, the insulating layer and the photoconductive semiconductor layer in combination serve as an inter-layer insulator. It will be seen that this inner-layer insulator can be formed by the same step as the formation of the photoelectric conversion section and the switch section.

FIGS. 28A to 28E are longitudinal sectional views of this embodiment in different steps of the production process.

Figure 28A:
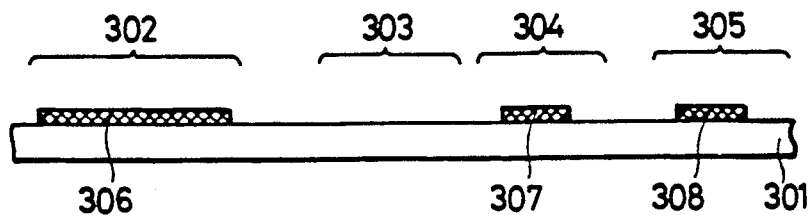
FIGS. 28A to 28E are fragmentary cross-sectional views of the line sensor in different steps of the production process.

As the first step, Al/Cr is deposited to a thickness of 0.1 $\mu$m by vacuum deposition method, on the surface of a rinsed glass substrate having a high degree of smoothness and serving as the substrate 301, as shown in FIG. 28A. Then, a resist pattern was deformed by photolithographic method, thereby to form lower electrode wirings 306, 307 and 308 in the matrix wiring section 302, charge accumulating section 304 and the transfer switch section constituting the switch section 305.

Figure 28B:
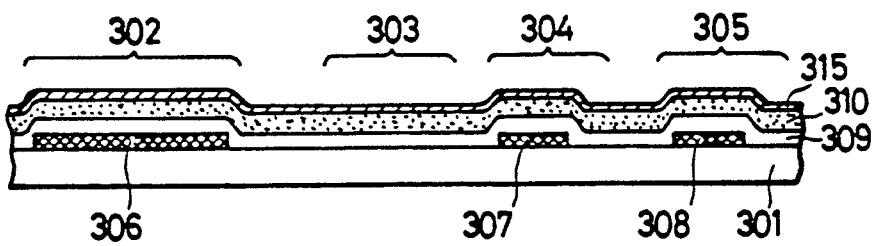

Then, as shown in FIG. 28B, an insulating layer 309 consisting of silicon nitride is deposited to a thickness of 0.3 $\mu$m by an RF glow discharge in accordance with plasma CVD method, using SiH$_4$ gas and NH$_3$ or N$_2$ gas as the material. Subsequently, a photoconductive semiconductor layer 310 as an amorphous silicon intrinsic layer is formed to a thickness of 0.1 to 1 μm, by the same method using SiH₄ as the material. Thereafter, an n+ layer 315 constituting the ohmic contact layer is deposited to a thickness of 0.1 μm using SiH₄ and PH₃ gas as the material.

Figure 28C:
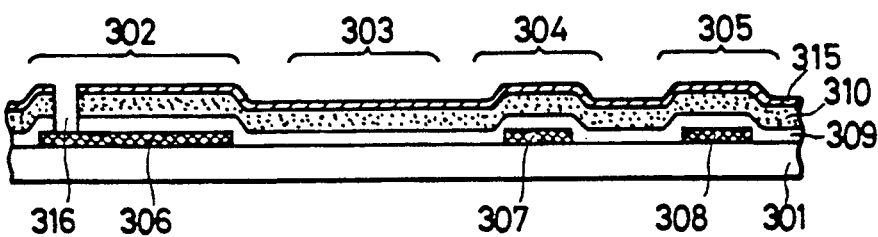

Then, as shown in FIG. 28C, a resist pattern is formed by photo-lithography and dry etching is effected with this resist pattern while suing CF₄ gas, so as to partially remove the n+ layer, photo-conductive semiconductor layer and the insulating layer thereby forming a contact hole 316. In this case, it is not necessary to effect a selective etching of the n+ layer, photo-conductive semiconductor layer and the insulating layer.

Figure 28D:
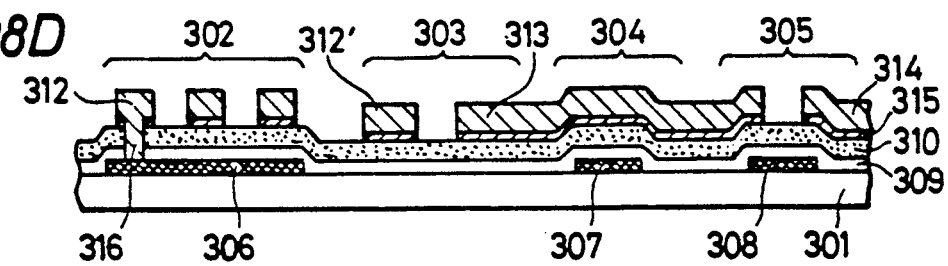

Then, as shown in FIG. 28D, Al/cr is deposited to a thickness of 1.0 to 1.5 μm by vacuum deposition. Then, a resist pattern is formed by photolithographic method and a wet etching is effected so as to partially remove the Al/Cr layer and the n+ layer, thereby forming the upper electrode wirings 311, 312, 313, 314. The electrical connection to the lower electrode wiring 306 and the upper electrode wiring 312 of the wiring section 302 arranged in the form of a matrix is made through the contact holes 316. The gap of the photoelectric conversion section 303 and the channel of the transfer transistor serving as the switch section 30 are also formed in this step of the production process.

Figure 28E:
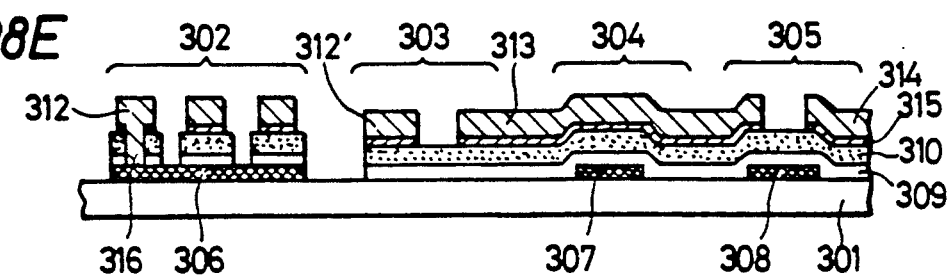

Then, a resist pattern is formed by a photolithographic method as shown in FIG. 28E, and dry etching was effected by using CF₄ gas, whereby the n+ layer, photoconductive semiconductor layer and the insulating layer are partially removed. In consequence, the elements which have been connected through the photoconductive semiconductor layer are isolated, sot hat electrical connections are formed only in the portions which require such connection.

Then, the line sensor is completed by forming a passivation film (not shown) by silicon nitride or an organic resin.

Figure 29:
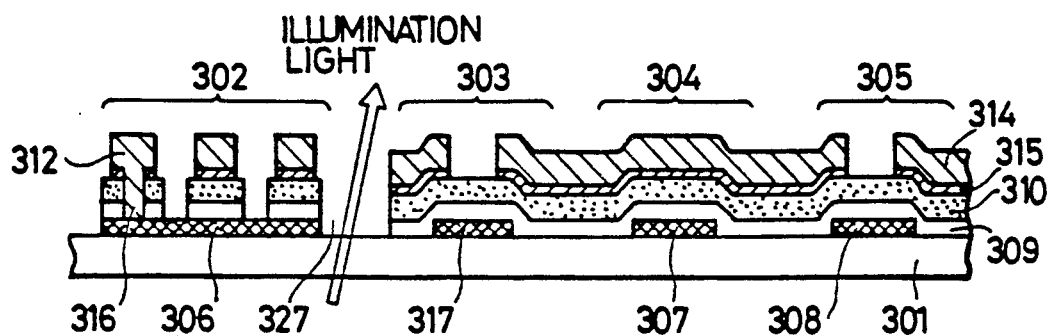
FIG. 29 is a fragmentary cross-sectional view of the line sensor shown in FIG. 25.

The line sensor shown in FIG. 25 also can be formed by the process explained in connection with FIGS. 28A to 28E. In this case, however, it is necessary to form the light shielding layer 317 shown in FIG. 29 in each of the sections. To this end, the shielding layer 317 is formed simultaneously with the formation of the lower electrodes 306, 307 and 308 shown in FIG. 28A.

A description will be made here with reference to FIGS. 30A to 30E as to a still further embodiment in which the patterns of the upper electrode and the lower electrode shown in FIG. 19 are replaced by each together. Namely, while the transfer transistor in the embodiment shown in FIGS. 28A to 28E are of so-called lower-gate staggered type TFT, the embodiment shown in FIGS. 30A to 30E employs a transfer transistor of so-called upper-gate staggered type.

More specifically, FIGS. 30A to 30E are sectional views of this embodiment in different steps of the production process.

Figure 30A:
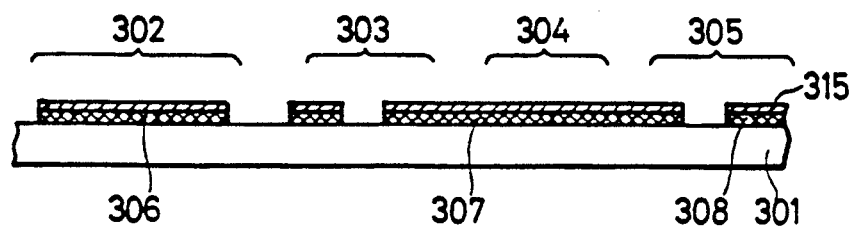
FIGS. 30A to 30E are fragmentary cross-sectional views of the line sensor in different steps of the production process.
Figure 30B:
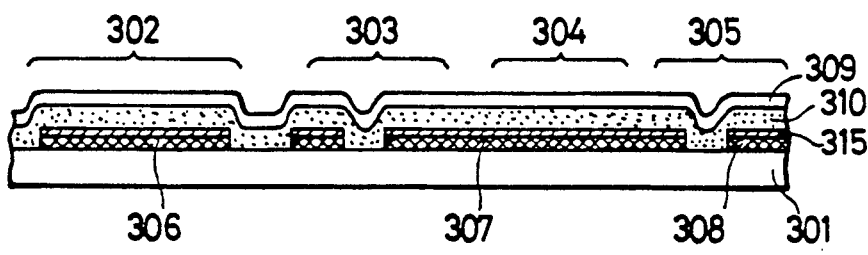
Figure 30C:
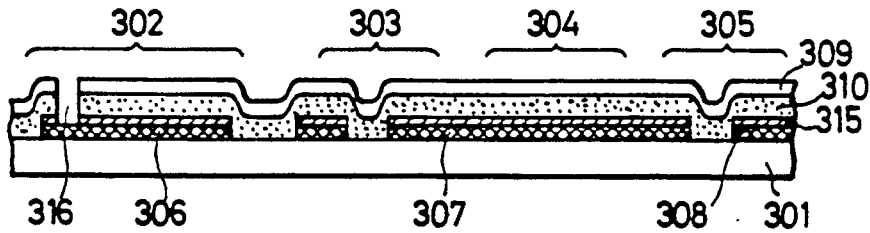
Figure 30D:
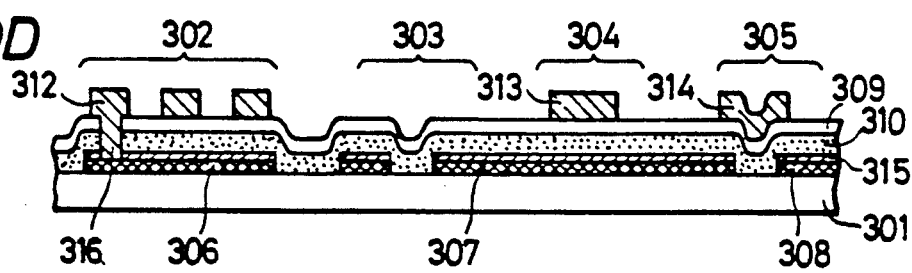
Figure 30E:
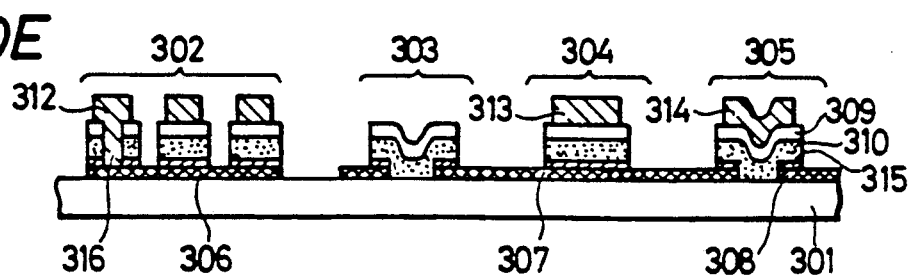

Referring to FIG. 30E, on the substrate 301 are formed a lower electrode wiring 306 of the wiring section 302, lower electrode wiring 307 of the charge accumulating section 304, and a lower electrode wiring 308 of the switch section 305. An n+ layer 315 constituting an ohmic contact layer is formed on the lower electrode wirings 306, 307 and 308. A photoconductive semiconductor layer 310 is formed on the n+ layer 15 and in the area between the lower electrode wirings of the photoelectric conversions section 303 and the switch section 305. On the semiconductor layer 310 are formed an insulating layer 309 and upper electrode wiring sections 312, 313, 314. In the switch section 305, the upper electrode wiring 314 constitutes the gate electrode, while the lower electrode wiring 308 constitutes a source electrode. One end of the lower electrode wiring 307 constitutes a drain electrode.

When light impinges upon the photoelectric conversion section 302, electric current is generated by the photoelectric effect and this electric current is supplied to the charge accumulating section 304 from the photoelectric conversion section 303 through the lower electrode wiring 307. As it the case of the embodiment explained in connection with FIGS. 28A to 28E, the charge accumulating section 304 is composed of the lower electrode wiring 307, n+ layer 315, photoconductive semiconductor layer 310, simulating layer 309, and the upper electrode wiring 313. The charges thus accumulated are successively transferred for the reading purpose, through the photoconductive semiconductor layer 310 and the lower electrode wiring 308, in response to the turning on and off of the gate electrode constituted by the upper electrode wiring 314 of the transfer transistor section serving as the switch section 305, in accordance with the signal successively delivered through the matrix wiring section 302.

A description will be made herein under as to an example of the process for producing the line sensor described above.

As the first step, Al/Cr is deposited to a thickness of 0.1 μm by vacuum deposition method, on the surface of a rinsed glass substrate having a high degree of smoothness and serving as the substrate 301, as shown in FIG. 30A. Then, the n+ layer 315 as the ohmic contact layer is formed by an RF glow discharge in accordance with plasma CVD method, suing SiH₄ gas and PH₃ gas as the material, to a thickness of 0.1 μm. Subsequently, a resist pattern is formed by photolithographic method, and wet etching is conducted by using this resist pattern, there by forming the lower electrode wirings 306, 307 and 308 of the matrix wiring section 302, charge accumulating section 304 and the transfer switch section 305, as well as the n+ layer 315.

Then, as shown in FIG. 30B, the photoconductive semiconductor layer 310 as an amorphous silicon intrinsic layer is deposited to a thickness of 0.1 to 1 μm by an RF glow discharge in accordance with plasma CVD method, using SiH₄gas as the material. Subsequently, the insulating layer 309 of silicon nitride is formed by deposition to a thickness of 0.3 μm by the same method, using SiH₄ gas and NH₃ or N₂ gas as the material.

Subsequently, as shown in FIG. 30C, a resist pattern is formed by a photolithographic method and the dry etching is effected with this resist pattern while using CF₄ gas, so as to partially remove the insulating layer, photoconductive semiconductor layer and then + layer, thus forming the contact hole 316. In this case, it is not necessary to selectively etch the insulating layer, photoconductive semiconductor layer and the n+ layer.

Then, as shown in FIG. 30D, Al/Cr to a thickness of 1.0 to 2.0 μm, by vacuum deposition method. Thereafter, a resist pattern is formed by photolithography, and wet etching is conducted to partially remove the Al/Cr so as to form the upper electrode wirings 312, 313, 314. In this case, the lower electrode wirings 306 and the upper electrode wirings 312 of the wiring section arranged in the form of a matrix are electrically operated through the contact holes 316. In the transfer transistor section serving as the switch section 305, the upper electrode wiring 314 constitutes the gate electrode.

Then, as shown in FIG. 30E, a resist pattern is formed by photolithography and dry etching is effected by using CF$_4$ gas, thereby partially remove the insulating layer, photoconductive semiconductor layer and the n+ layer, so as to isolate the elements which have been electrically connected. Thus, electric connection is made only in the portions where such a connection is necessary. The line sensor of this embodiment is thus completed.

From the view point of electrical driving of the device, it is preferred that the photoelectric conversion section, charge accumulating sections and the switch sections of the line sensor in the form of array have uniform distributions of the electric characteristics. The electric characteristic distribution in turn is largely affected by the thickness distribution of the insulating layer and the photoconductive semiconductor layers.

In this embodiment, the thicknesses of the insulating layer and the photoconductive semiconductor layer are determined when they are formed by deposition in the step shown in FIG. 30B, and no change in the thicknesses is caused in the subsequent steps shown in FIGS. 30C to 30E. It is, therefore, possible to make uniform the distribution of the electric characteristics and, hence, to obtain a line sensor having a degree of uniformity of the operation characteristics, provided that a good condition is given for the deposition such as to uniformalize the thickness distribution.

A description will be made as to a still further embodiment of the invention.

Figure 31:
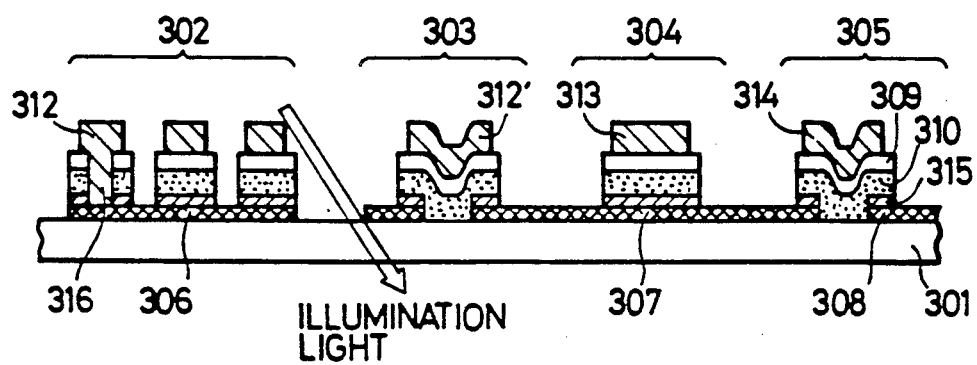
FIG. 31 is a fragmentary cross-sectional view of another line sensor.

FIG. 31 is a fragmentary sectional view of the a line sensor as the still further embodiment.

In this embodiment, a light-shielding layer 312' is formed on the upper portion of the photoelectric conversion section 303 of the preceding embodiment. Thus, this line sensor is of so-called lens-less type in which the light impinges from the element side of the substrate and the light reflected by an original held in contact with the reverse side of the substrate is directly read by the photoelectric conversion section. The illuminating light illuminates the original from the element side of the substrate. The light-shielding layer 312' effectively prevents the illuminating light from coming into the photoconductive semiconductor section of the photoelectric conversion section 303, thereby diminishing generation of noise currents.

The line sensor of this embodiment can be produced substantially by the same method as that explained in connection with FIGS. 30A to 30E. In this embodiment, however, it is necessary to form the light-shielding layer 312'. This light-shielding layer 312' can be formed simultaneously with the formation of the upper electrode wirings 312, 313, 314 from the same material as that of these wirings.

As will be understood from FIG. 31, the light-shielding layer 312' is provided on the upper portion of the photoelectric conversion section, and has a function to sufficiently attenuate any dark current when it is supplied with a bias voltage which is usually negative. The light-shielding layer 312', which is provided in the described embodiment to the upper layer of the photoelectric conversion section 302, may be provided on a unit housing to which the line sensor of this embodiment is secured, so as to prevent the illuminating light from impinging upon the photoelectric conversion section. In this case, however, it is necessary to attain a positional alignment between the light-shielding layer on the unit housing and the line sensor.

In general, the line sensor of the lens-less type requires the original to be placed in the vicinity of the photoelectric conversion section 330. In this embodiment, the original is positioned on the reverse side of the substrate 301. The substrate 301 is usually constituted by a glass plate. The glass substrate exhibits superior optical characteristics and wear resistance, and can serve also as a spacer for fixing the positional relationship between the photoelectric conversion section 302 and the original.

Thus, in this embodiment of the present invention, it is possible to produce a line sensor of lens-lens type without requiring any specific members, by suitably designing the factors such as the thickness of the substrate, incident angle of the light, and so forth. Furthermore, in this embodiment, the photoelectric conversions section is provided on the substrate so that the light reflected by the original surface is transmitted only two smooth inter-surfaces, i.e., the inter-surface between the original surface and the substrate surface and the inter-surface between the substrate surface and the surface of the photoelectric conversion section. This remarkably facilitates the optical design of the device. In addition, the described embodiment makes it possible to protect the photoconductive semiconductor layer which is vary important from the view point of characteristics of photoelectric conversion section and the switch section, from damaging and contamination which may occur during the production.

A still further embodiment of the photoelectric conversion device, as well as a production process thereof, will be described hereinunder. This embodiment employs, in place of the n+ layer of the embodiment explained in connection with FIGS. 28A to 28E, an insulating layer of silicon nitride, and this silicon nitride layer is perforated to form a contact hole, thus attaining the electrical connection between the photoconductive semiconductor layer and the upper electrode wiring.

FIGS. 32A to 32E are fragmentary sectional views of the line sensor in different steps of the production process.

Figure 32A:
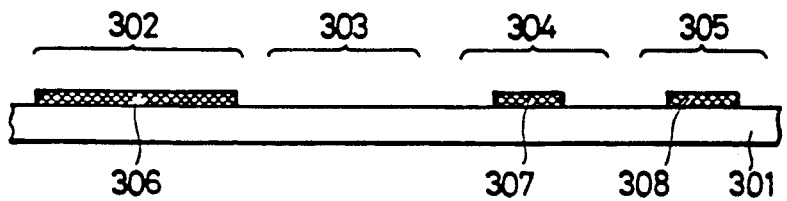
FIGS. 32A to 32E are fragmentary cross-sectional views of the line sensor in different steps of the production process.

As the first step, Al/Cr is deposited to a thickness of 0.1 μm by vacuum deposition method, on the surface of a rinsed glass substrate having a high degree of smoothness, as shown in FIG. 32A. Then, a resist pattern is formed by photolithographic method, and wet etching is conducted with this resist pattern thereby to form lower electrode wirings 306, 307 and 308 in the matrix wiring section 302, charge accumulating section 304 and the transfer switch section constituting the switch section 305.

Figure 32B:
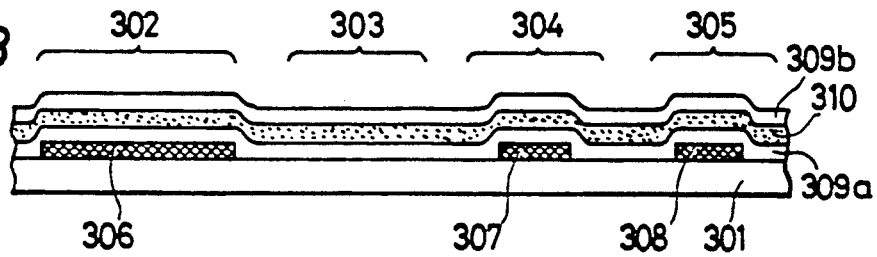

Then, as shown in FIG. 32B, an insulating layer 309a consisting of silicon nitride is deposited to a thickness of 0.3 μm by an RF flow discharge in accordance with plasma CVD method, using SiH$_4$ gas and NH$_3$ or N$_2$ gas as the material. Subsequently, a photoconductive semiconductor layer 310 as an amorphous silicon intrinsic layer is formed to a thickness of 0.1 to 1 μm, by the same method using SiH$_4$ as the material. Thereafter, an insulating layer 309b of silicon nitride is deposited to a thickness of 0.3 μm by using SiH$_4$ gas and NH$_3$ or N$_2$ gas as the material.

Figure 32C:
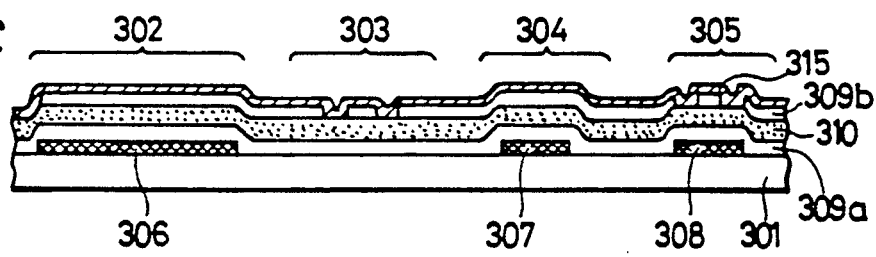
Figure 32D:
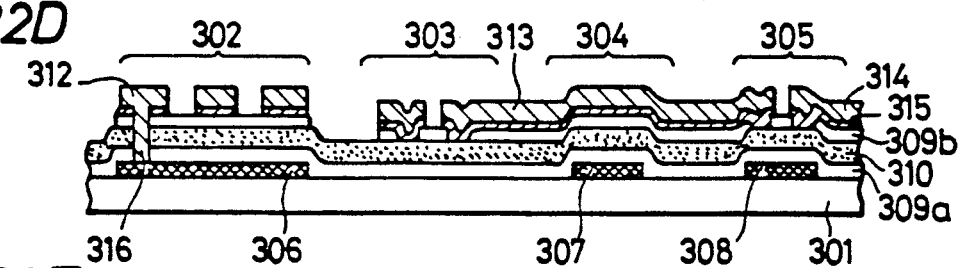

Then, as shown in FIG. 32C, a resist pattern is formed by photo-lithography and dry etching is effected with this resist pattern while using CF$_4$ gas, so as to form an opening in the insulating layer 309b. Subsequently, an n+ layer 315 as the ohmic contact layer is deposited to a thickness of 0.1 μm by using SiH₄ gas and PH₃ gas as the material. Then, as shown in FIG. 32D, a resist pattern is formed by photolithography, and dry etching is effected by the CF₄ gas so as to partially remove the n+ layer, the insulating layer, and the photoconductive semiconductor layer, thereby forming a contact hole 316. In this case, it is not necessary to effect a selective etching of the n+ layer, photoconductive semiconductor layer and the insulating layer.

Then, Al/Cr is deposited to a thickness of 1.0 to 1.5 μm by vacuum deposition. Then, a resist pattern is formed by photolithographic method and a wet etching is effected so as to partially remove the Al/Cr layer and the n+ layer, thereby forming the upper electrode wirings 312, 313 and 314. The electrical connection to the lower electrode wiring 306 and the upper electrode wiring 312 of the wiring section 302 arranged in the form of a matrix is made through the contact holes 316. The gap of the photoelectric conversion section 303 and the channel of the transfer transistor serving as the switch section 305 are also formed in this step of the production process.

Figure 32E:
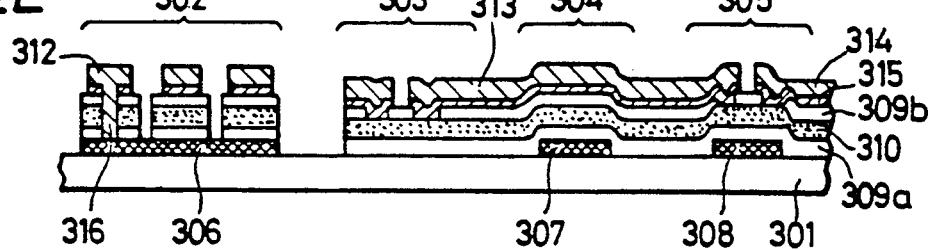

Then, a resist pattern is formed by a photolithographic method as shown in FIG. 32E, and dry etching is effected by using CF₄ gas, whereby the n+ layer, photoconductive semiconductor layer and the insulating layer are partially removed. In consequence, the elements which have been connected through the photoconductive semiconductor layer are isolated, so that electrical connections are formed only in the portions which require such connection.

Then, a passivation film (not shown) is formed from silicon nitride or an organic resin, thus completing the production of the line sensor.

It is preferred that the photoelectric conversion sections and the switch sections of the line sensor arranged in the form of array have uniform distribution of the electric characteristics. In this embodiment, the characteristic distribution can be made uniform merely through the control of thickness distribution in the steps for forming layers. In this embodiment, the gap portions and the channel portions which are critical in the photoelectric conversion section and the switch section are protected by the insulating layer formed in the course of formation of the film, so that the gap portions and the channel portions are never affected by subsequent steps. In addition, since the layers are formed successively, ti is possible to protect the interface between the semiconductor layer and the insulating layer against contamination by impurities. Furthermore, since the photoconductive semiconductor layer is already covered by the insulating film, the material of the final passivation film can have a large variety.

Figure 33:
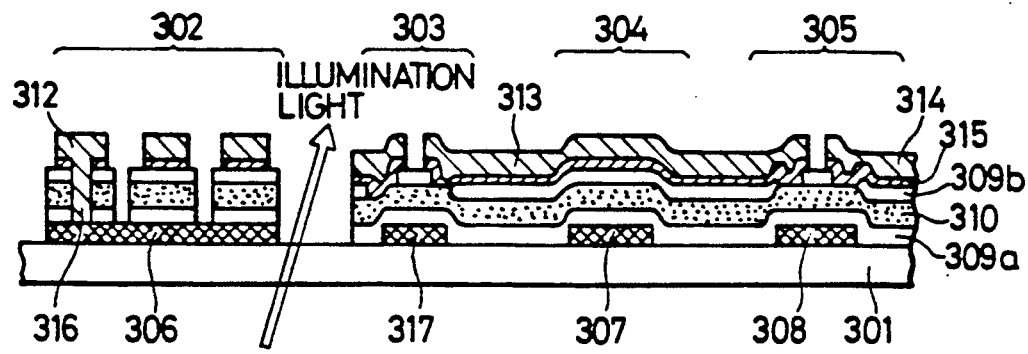
FIG. 33 is a fragmentary cross-sectional view of still another line sensor.

A description will be made hereinunder as to a still further embodiment of the invention. This embodiment is similar to the embodiment shown in FIGS. 32A to 32E, except that a light-shielding layer 317 is formed on the lower part of the photoelectric conversions section 303 of the embodiment shown in FIG. 32. In operation, the light impinges from the substrate side, and the light reflected from an original contacting the surface of the photoelectric conversion section is directly read by the photoelectric conversion section. FIG. 33 is a fragmentary sectional view of an example of this embodiment. As will be seen from this figure, the light impinges upon the original from the same side so as the substrate.

the process for producing the photoelectric conversion device of this embodiment is materially the same as that shown in FIGS. 32A to 32E. In this embodiment, however, the light-shielding layer 317 is formed simultaneously with the formation of the lower electrode wirings 306, 307 and 308 from the same material as these wirings.

In the embodiments shown in FIGS. 25 and 31, as well as the embodiment shown in FIG. 33, adopts such a construction that the light incident to the photoelectric conversions section impinges from the upper side, so that the photoelectric conversion characteristics are significantly attected by the state of the upper inter-surface of the photoconductive semiconductor layer in the gap portion of the photoelectric conversion section. In these embodiments, however, the inter-surface of the gap portion is formed by continuous film forming sets and is protected by the insulating layer in the subsequent steps. Therefore, the inter-surface is less likely to be affected and contaminated by impurities, as compared with the case where the gap portion is formed by, for example, etching process. In consequence, these embodiments offers an advantage that the operation characteristics of the photoelectric conversion device are remarkably stabilized. In addition, since the photoconductive semiconductor layer is already covered by the insulating layer, the material of the passivation film which is to be formed finally can have a wide selection.

As will be understood from the foregoing description, this embodiment of the present invention offers a production process in which an insulating layer and a photoconductive semiconductor layer on the insulating layer are formed in at least the photoelectric conversion section, charge accumulating section and the switch section, and then the insulating layer and the photoconductive semiconductor layer are patterned. With this process, it is possible to prevent the insulating layer from being degraded in the subsequent steps such as etching, and to suppress the occurrence of troubles such as short-circuiting in the charge accumulating section and in the areas where the upper and lower wirings intersect each other, fluctuation in the capacitance, and degradation of insulation in the area where the electrode wirings intersect each other, whereby the reliability is improved remarkably.

In addition, since the major constituents of the photoelectric conversion device can be formed simultaneously, the processes for the formation of layers and formation of elements can be simplified. Furthermore, since the constituents have the same basic construction, the device can be produced with a high scale of integration so that the size of the device can be reduced advantageously. For these reasons, ti is possible to reduce the production costs and to increase the degree of freedom in the design of the photoelectric conversion device.

When a plurality of layers are to be formed in this embodiment, the insulating layer and the photoconductive semiconductor layer formed on this insulating layer are patterned and used as an inter-layer insulator. Thus, the inter-layer insulator can be formed in the same step as that for forming the photoelectric conversion section and the charge accumulating section.

What is claimed is:

1. A method for producing a device having a charge accumulating element provided with upper and lower electrodes, a first semiconductor layer and an insulating layer and a transistor electrically connected with said charge accumulating element provided with a gate electrode, a gate insulating layer and a second semiconductor layer, said charge accumulating element and said transistor being formed on an insulating surface of a common substrate, comprising the steps of:

forming said lower electrode and said gate electrode on said insulating surface;

forming said insulating layer and said gate insulating layer on said lower electrode and said gate electrode in a same first deposition process step so that said insulating layers are constituted of a common layer;

forming said first and second semiconductor layers on said insulating layers in a same second deposition process step, said semiconductor layers being a thin film; and forming source and drain electrodes and said upper electrode.

2. A method according to claim 1, wherein said first and second semiconductor layers are formed by a glow discharge decomposition of silane.

3. A method according to claim 1, wherein said first and second semiconductor layers comprise amorphous silicon.

4. A method according to claim 1, wherein before forming said upper electrode and said source and drain electrodes, a semiconductor layer doped with an impurity is formed.

* * * * *

UNITED STATES PATENT AND TRADEMARK OFFICE
CERTIFICATE OF CORRECTION

PATENT NO. : 5,306,648
DATED : April 26, 1994
INVENTOR(S) : MASAKI FUKAYA ET AL.

Page 1 of 4

It is certified that error appears in the above-identified patent and that said Letters Patent is hereby corrected as shown below:

COLUMN 2

Line 60, "vie" should read --view--.
Line 62, "sectional" should read --cross-sectional--.

COLUMN 3

Line 40, "herein under" should read --hereinunder--.
Line 41, "(Coning" should read --(Corning--.

COLUMN 4

Line 61, "doe snot" should read --does not--.

COLUMN 5

Line 16, "if" should read --is--.
Line 18, "remarkably" should read --remarkable--.
Line 24, "(Coning" should read --(Corning--.
Line 38, "to" should read --to be--.
Line 52, "0.12µas" should read --0.12µ as--.
Line 55, "ration" should read --ratio--.

COLUMN 6

Line 19, "above" should read --above.--.

COLUMN 7

Line 46, "(Coning" should read --(Corning--.

UNITED STATES PATENT AND TRADEMARK OFFICE
CERTIFICATE OF CORRECTION

PATENT NO. : 5,306,648
DATED : April 26, 1994
INVENTOR(S) : MASAKI FUKAYA ET AL.           Page 2 of 4

It is certified that error appears in the above-identified patent and that said Letters Patent is hereby corrected as shown below:

COLUMN 8

Line 16, "100 Å" should read --1000 Å--.

COLUMN 9

Line 14, "(Coning" should read --(Corning--.

COLUMN 11

Line 6, "an" should read --and--.
Line 26, "embodiment," should read --embodiments,--.
Line 62, "an" should read --and--.

COLUMN 14

Line 20, "sued" should read --used--.
Line 38, "lie" should read --line--.
Line 45, "vies" should read --views--.
Line 59, "FIG. 24 B" should read --FIG. 24B--.

COLUMN 15

Line 17, "layer so" should read --layers--.
Line 30, "n" should read --on--.
Line 43, "sued" should read --used--.

COLUMN 17

Line 51, "to-" should read --other.--.
Line 52, "gether." should be deleted.

UNITED STATES PATENT AND TRADEMARK OFFICE
CERTIFICATE OF CORRECTION

PATENT NO. : 5,306,648
DATED : April 26, 1994
INVENTOR(S) : MASAKI FUKAYA ET AL.    Page 3 of 4

It is certified that error appears in the above-identified patent and that said Letters Patent is hereby corrected as shown below:

COLUMN 18

Line 14, "it" should read --in--.
Line 28, "herein" should read --hereinunder--.
Line 37, "suing" should read --using--.
Line 49, "SiH$_4$gas" should read --SiH$_4$ gas--.
Line 61, "Al/Cr to" should read --Al/Cr is deposited to--.

COLUMN 19

Line 6, "remove" should read --removing--.

COLUMN 20

Line 28, "layer" should read --layer,--.
Line 29, "vary" should read --very--.
Line 68, "CF$_4$gas," should read --CF$_4$ gas,--.

COLUMN 21

Line 49, "ti" should read --it--.
Line 68, "so" should be deleted.

UNITED STATES PATENT AND TRADEMARK OFFICE
CERTIFICATE OF CORRECTION

PATENT NO. : 5,306,648
DATED : April 26, 1994
INVENTOR(S) : MASAKI FUKAYA ET AL.    Page 4 of 4

It is certified that error appears in the above-identified patent and that said Letters Patent is hereby corrected as shown below:

COLUMN 22

Line 9, "adopts such" should read --adopts--.
Line 13, "attected" should read --affected--.
Line 17, "sets" should read --steps--.
Line 23, "offers" should read --offer--.

Signed and Sealed this

Twenty-eight Day of February, 1995

Attest:

BRUCE LEHMAN

Attesting Officer    Commissioner of Patents and Trademarks